(12) United States Patent
Swanson

(10) Patent No.: US 6,931,513 B2
(45) Date of Patent: *Aug. 16, 2005

(54) DATA CONVERTER WITH STATISTICAL DOMAIN OUTPUT

(76) Inventor: Eric Swanson, 850 Jerry's La., Buda, TX (US) 78610

( * ) Notice: Subject to any disclaimer, the term of this patent is extended or adjusted under 35 U.S.C. 154(b) by 0 days.

This patent is subject to a terminal disclaimer.

(21) Appl. No.: 10/868,180

(22) Filed: Jun. 15, 2004

(65) Prior Publication Data

US 2005/0038942 A1 Feb. 17, 2005

Related U.S. Application Data

(60) Division of application No. 09/416,700, filed on Oct. 12, 1999, now Pat. No. 6,751,690, which is a continuation-in-part of application No. 09/404,667, filed on Sep. 23, 1999, now Pat. No. 6,369,738, which is a continuation-in-part of application No. 09/376,761, filed on Aug. 17, 1999, now Pat. No. 6,751,641.

(51) Int. Cl.[7] .................. G06F 13/12; G06F 15/00; G06F 15/76; H03M 1/00; H03M 1/12
(52) U.S. Cl. .............. 712/32; 712/34; 712/35; 712/36; 712/38; 710/65; 710/69; 341/126; 341/155; 341/158; 708/202; 708/207; 708/445
(58) Field of Search .................. 710/62, 65, 69, 710/70, 72–74; 712/32, 34–36, 38; 341/50, 126, 155, 158; 324/76.11; 708/202, 207, 230, 400, 445

(56) References Cited

U.S. PATENT DOCUMENTS

| | | | | |
|---|---|---|---|---|
| 4,054,785 A | * | 10/1977 | Lehmann | 708/405 |
| 4,525,673 A | * | 6/1985 | Berkowitz | 324/312 |
| 4,742,551 A | * | 5/1988 | Deering | 382/170 |
| 5,206,601 A | * | 4/1993 | Ready | 329/317 |
| 5,388,058 A | * | 2/1995 | Yamada | 708/200 |
| 5,630,153 A | * | 5/1997 | Intrater et al. | 712/35 |
| 5,745,190 A | * | 4/1998 | Ioka | 348/700 |
| 6,041,142 A | * | 3/2000 | Rao et al. | 382/232 |
| 6,369,738 B1 | * | 4/2002 | Swanson | 341/155 |
| 6,529,842 B1 | * | 3/2003 | Williams et al. | 702/66 |
| 6,643,713 B2 | * | 11/2003 | Nakagawa et al. | 710/5 |
| 6,751,641 B1 | * | 6/2004 | Swanson | 708/403 |
| 6,751,690 B1 | * | 6/2004 | Swanson | 710/72 |
| 6,845,176 B1 | * | 1/2005 | Sezan | 382/168 |
| 2005/0021580 A1 | * | 1/2005 | Swanson | 708/405 |

* cited by examiner

*Primary Examiner*—Jeffrey Gaffin
*Assistant Examiner*—Tanh Q. Nguyen
(74) *Attorney, Agent, or Firm*—Howison & Arnott, L.L.P.

(57) ABSTRACT

An integrated circuit having statistical processing capability. The integrated circuit has an input for receiving input data in a first data domain. A data converter is provided for converting received input data from the first domain to a second domain different from the first domain. A statistical processor is provided for obtaining statistical information from the output of the data converter and processing the obtained statistical information in accordance with a predetermined processing algorithm. An output on the integrated circuit allow access of the processed statistical information by the statistical processor external to the integrated circuit.

44 Claims, 13 Drawing Sheets

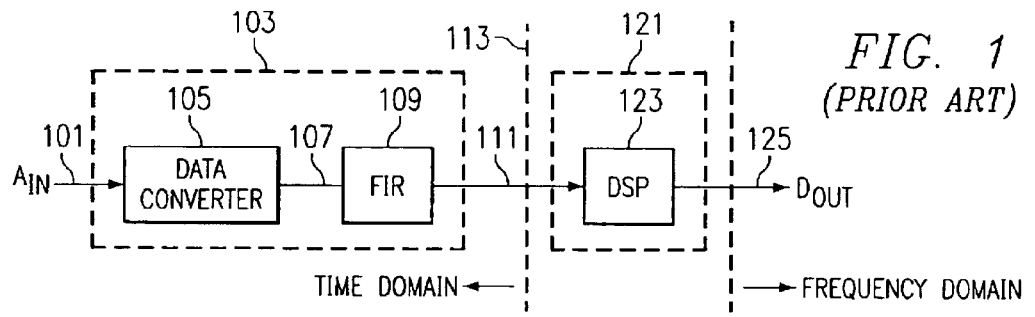
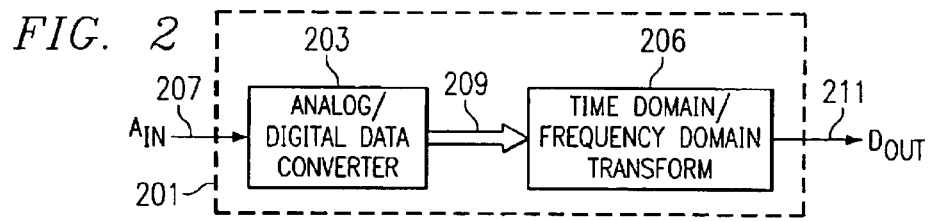
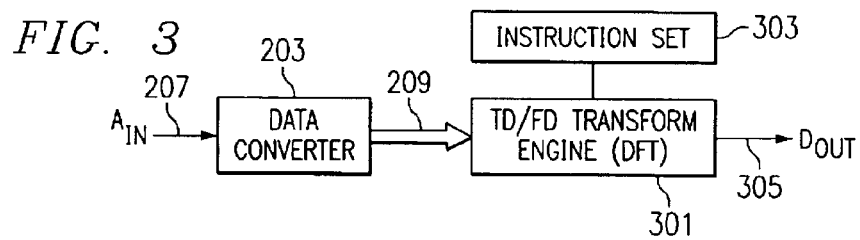
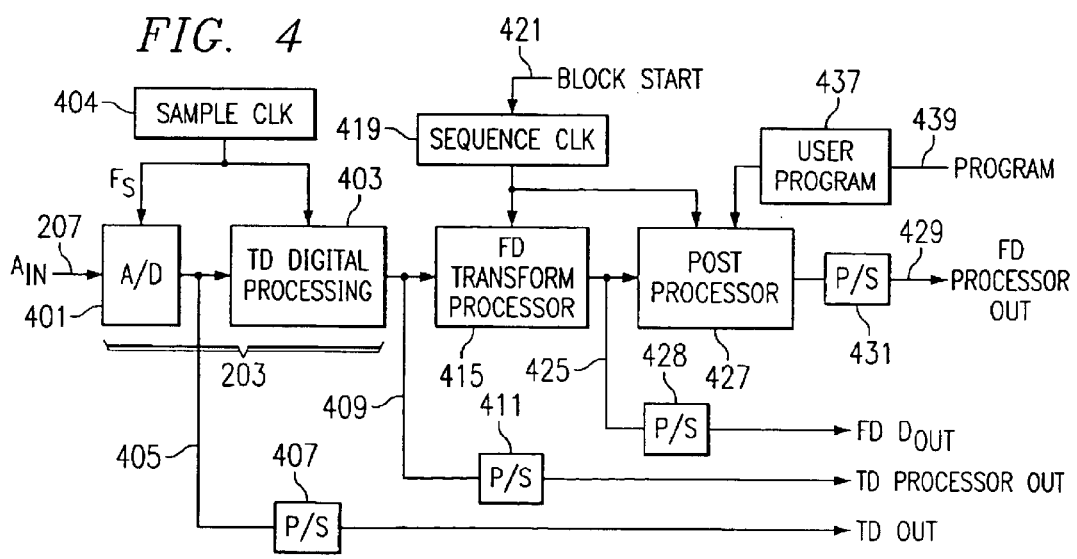

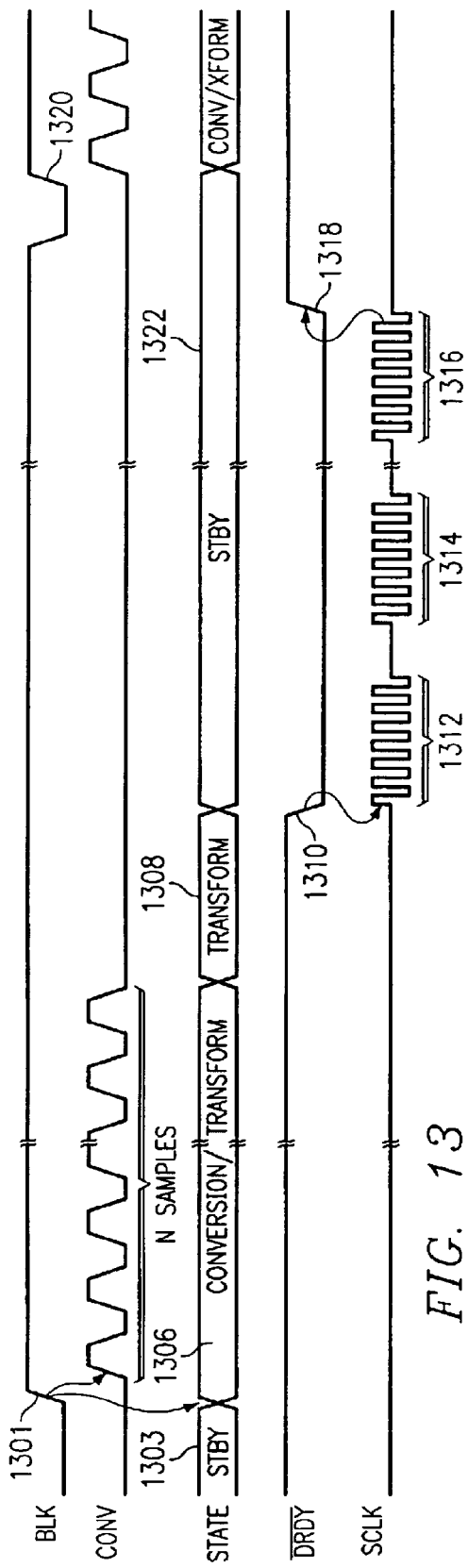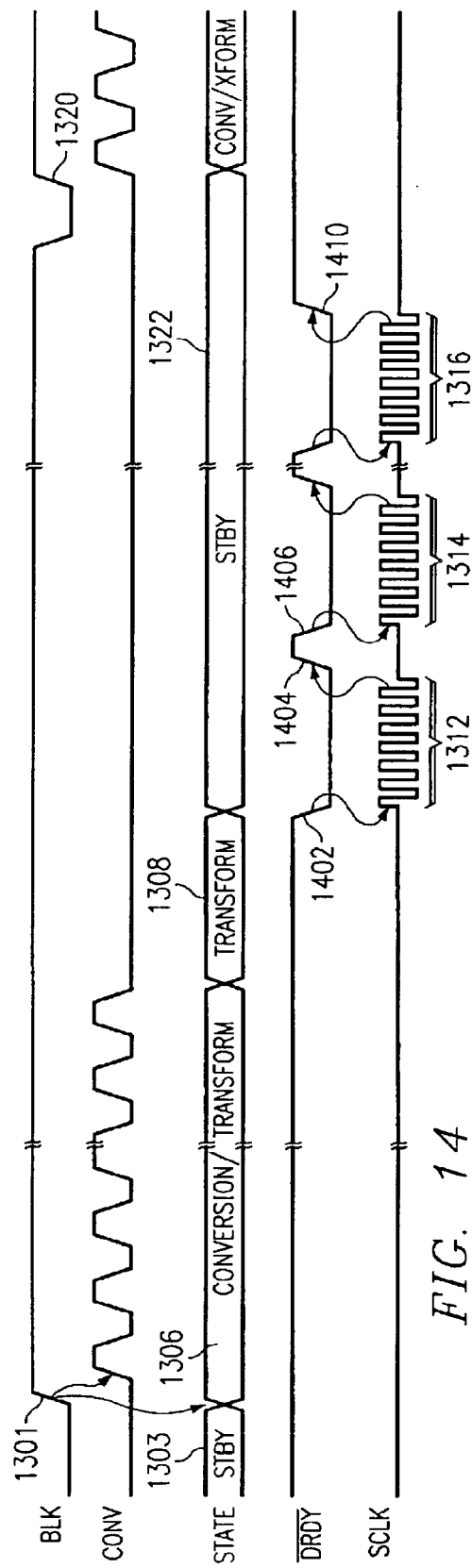

DATA CONVERTER WITH STATISTICAL DOMAIN OUTPUT

CROSS REFERENCE TO RELATED APPLICATION

This application is a Divisional of U.S. patent application Ser. No. 09/416,700 entitled "DATA CONVERTER WITH STATISTICAL DOMAIN OUTPUT", filed Oct. 12, 1999 and issued as U.S. Pat. No. 6,751,690, which is a Continuation-in-part of U.S. patent application Ser. No. 09/404,667, filed Sep. 23, 1999 and issued as U.S. Pat. No. 6,369,738, which is a Continuation-in-part of U.S. patent application Ser. No. 09/376,761 entitled "TIME DOMAIN DATA CONVERTER WITH OUTPUT FREQUENCY DOMAIN CONVERSION", filed on Aug. 17, 1999 and issued as U.S. Pat. No. 6,751,641.

TECHNICAL FIELD OF THE INVENTION

The present invention pertains in general to data converters and, more particularly, to a data converter with the output thereof processed through a statistical domain transform to provide a statistical output.

BACKGROUND OF THE INVENTION

Conventional data converters provide either conversion from the analog domain to the digital domain in a typical analog-to-digital converter, or from the digital domain to an analog domain as a digital-to-analog converter. Typical analog-to-digital (A/D) converters of the delta sigma type provide some type of analog modulator for providing the initial data conversion, which is then followed by some type of filtering step. Conventionally, the filtering is performed in part in the digital domain. This requires some type of digital processing of the digital output of the modulator in the form of a digital filter such as a Finite Impulse Response (FIR) filter. However, the digital values output therefrom are values that exist in the time domain.

In some applications, it is desirable to determine information in the frequency domain after the conversion operation. Such applications as spectrum analyzers, for example, require such information. Therefore, the output of the data converter in the digital domain is then processed through some type of transform for converting time domain information to frequency domain information, this all completed in the digital domain.

The types of transform engines that are utilized to convert time domain information to digital domain information typically utilize some type of Fourier Transform, the most common being a Discrete Fourier Transform (DFT). The DFT is a one-to-one mapping of any finite sequence $\{y(r)\}$, $r=0, 1, 2 \ldots, N-1$ of N samples onto another sequence. This is defined by the following relationship:

$$Y(k) = \sum_{r=0}^{N-1} y(r) w_N^{rk}$$

where:

$$w_N \equiv e^{-j2\pi/N} = \cos\frac{2\pi}{N} - j\sin\frac{2\pi}{N}$$

In general, a DFT algorithm requires a plurality of multiplication/accumulation operations. To reduce the number of these multiplication/accumulations, a Fast Fourier Transform (FFT) can be implemented to provide a rapid means for computing a DFT with $N\log_2 N$ multiplies, which otherwise would have taken $N^2$ complex multiplications. Even with the reduction of the number of multiplications, there are still a large number of multiplication/accumulation operations that are required in order to calculate the time domain/frequency domain conversion. Conventionally, a Digital Signal Processor (DSP) is required which is typically a separate integrated circuit. As such, whenever providing for both a data conversion operation with an A/D converter, and a time domain/frequency domain conversion with a DSP, there are typically required two integrated circuits.

In general, there does not exist a commercial monolithic solution providing both the benefits of a data converter with that of a frequency domain converter such that an analog input can be received, converted to the digital domain and this digital value processed to provide a frequency domain output. In general, typical solutions utilize a data converter that provides a digital value in the time domain which is then input to a processor. This processor can be in the form of a microcontroller or a DSP. A data converter, due to its inherent construction, basically provides the ability to convert an analog input signal to a digital time domain output signal with a defined bit-resolution. This, of course, provides an output in the time domain. When processing this time domain signal to provide a frequency domain output, the processor is programmed to process some type of Discrete Fourier Transform or Fast Fourier Transform. Any type of algorithm that provides such a transform can be utilized. However, in order for a designer to utilize such a transform, this requires programming of the processor or microcontroller. Therefore, if an existing design must be upgraded to provide such a function or be required to process in the frequency domain, then a more complex DSP or microcontroller must be utilized. This is due to the fact that any processing in the frequency domain requires a more complex processing capability. The result is that an upgrade to a frequency domain solution from a time domain solution will probably require the designer to change his design to incorporate a much more complex processing section, in addition to also requiring a significant amount of programming of that processing section, this programming being the most expensive aspect of such an upgrade. It is desirable to utilize the pre-upgrade processing section, which is typically a relatively simple processor, and merely upgrade the data converter. However, the mere change of a design to process in the frequency domain as opposed to the time domain will necessitate additional processing capability and programming.

In addition to processing in the frequency domain, some applications require analysis of the statistics associated with a particular data conversion operation. These statistics can be utilized for the purpose of identifying when a particular parameter is fluctuating within its natural range, implying that no adjustment is desirable or necessary or when a parameter is behaving unnaturally, such that no maintenance or adjustment may be required. In modern embedded control systems, the data converters measure electrical parameters associated with the process, with several phenomena being monitored by a single data converter. Since these are "dumb" data converters, the digital output thereof is merely passed to a processor to perform some type of statistical operation thereon. At present, there is no monolithic solution that would allow statistical analysis to be performed prior to output of the actual digital value of the data conversion operation. This requires that all of the digital data be output, consuming significant I/O bandwidth.

SUMMARY OF THE INVENTION

The present invention disclosed and claimed herein comprises an integrated circuit having statistical processing capability. The integrated circuit has an input for receiving input data in a first data domain. A data converter is provided for converting received input data from the first domain to a second domain different from the first domain. A statistical processor is provided for obtaining statistical information from the output of the data converter and processing the obtained statistical information in accordance with a predetermined processing algorithm. An output on the integrated circuit allow access of the processed statistical information by the statistical processor external to the integrated circuit.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a prior art representation of a two chip converter and a time domain/frequency domain conversion operation;

FIG. 2 illustrates an overall diagrammatic view of a monolithic solution in accordance with the present disclosure;

FIG. 3 illustrates a block diagram of the data converter and the TD/FD transform engine;

FIG. 4 illustrates a more detailed block diagram of the integrated circuit of the present disclosure;

FIG. 13 illustrates one embodiment of a timing diagram for outputting data in the frequency domain utilizing the data-ready feature;

FIG. 14 illustrates an alternate embodiment to that of FIG. 13;

DETAILED DESCRIPTION OF THE INVENTION

Figure 5:
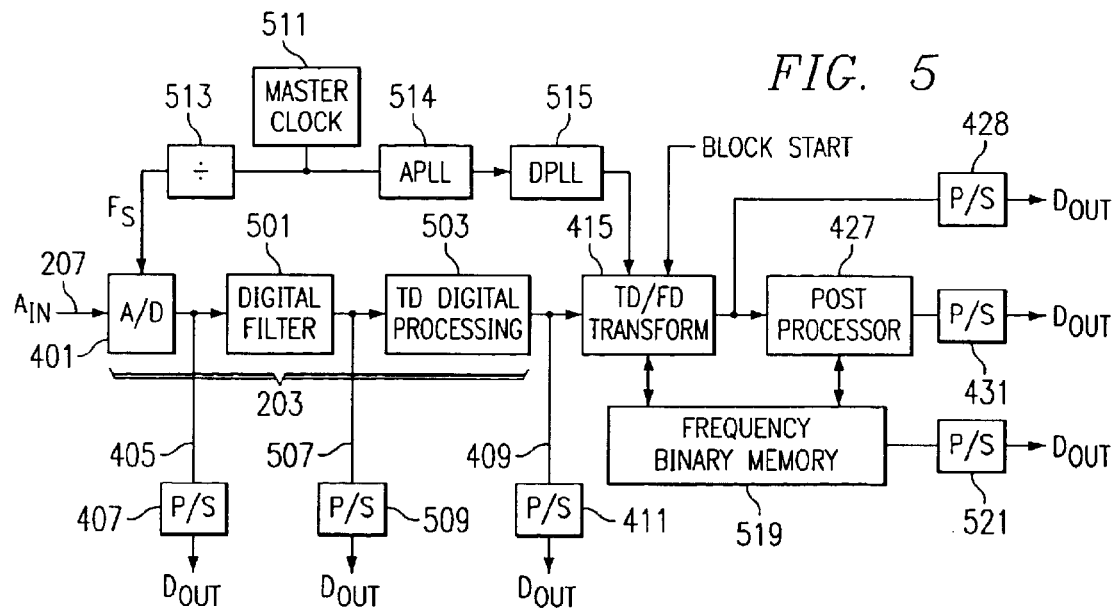
FIG. 5 illustrates a detailed block diagram of the present disclosure illustrating the various input/outputs at the post processing operation.

Referring now to FIG. 1, there is illustrated a block diagram of a prior art solution for receiving an analog signal, converting it to a digital domain signal, all in the time domain, and then converting it to the frequency domain to obtain frequency information therefrom. The analog signal $A_{IN}$ was received on an input 101 which is input to a first integrated circuit (IC) 103. The IC 103 is a basic analog-to-digital (A/D) converter. This is typically comprised of a data converter 105 which is operable to receive the analog input signal on the line 101, sample this signal at a predetermined sampling rate and convert each of the samples to a digital output value at the sampling rate. This data converter 105 can by any type of data converter such as a delta sigma converter, a successive approximation register (SAR) converter, or similar converter. This provides output digital values on a line 107 in the digital domain. This can then be processed by subsequent digital circuitry in a block 109, which block 109 illustrates a filter operation in the form of a Finite Impulse Response (FIR) filter, by way of example only. This provides an overall output from the IC 103 on a line 111 that is a stream of digital values.

Typically, the data converter 105 provides a multi-bit output with a defined data width. This is then input to the filter 109 which will typically operate at a higher data width. For example, the output of the data converter 105 may be a 12-bit output whereas the filter 109 processes in a 16-bit, or 32-bit data width. This will preserve the dynamic range of the initial A/D conversion. The filter 109 may then truncate the digital output values and then this output provided on a serial output by processing it through a parallel/serial converter (not shown). This, again, represents processing in the time domain, illustrated to the left of a phantom line 113.

The output of the IC 103 is input to an IC 121, which is basically comprised of a DSP engine 123. This DSP engine is operable to perform a pre-determined transform on the data to convert the digital data output by the IC 103 into frequency domain information on a digital output 125. Typically, although not limiting, this utilizes a DFT transform. This type of transform will require a finite number of samples within a block to glean the frequency information, with each block having a set size and starting point.

Referring now to FIG. 2 there is illustrated a block diagram of the integrated circuit of the present disclosure. However, it should be understood that, although this is referred to as an integrated circuit, it can be any monolithic solution wherein the combination of a data converter for converting information from one data domain to another data domain in a time domain is then processed through a transform to the frequency domain. In the present disclosure the overall conversion/conversion process is contained within an integrated circuit 201. The integrated circuit 201, as noted herein, is a monolithic solution that allows a data converter circuit 203 and a time domain/frequency transform block 206 in the form of a transform engine to be disposed on a single monolithic chip. The data converter 203, in the disclosed embodiment, is an analog/digital data converter. The data converter 203 receives an analog input from analog signal $A_{IN}$ on a line 207, samples the signal and converts this to digital values in the time domain for output on a bus 209. This is then input to the transform block 206 for conversion to the frequency domain and the frequency content information in the form of digital values. These digital values are output on an output 211, referred to as the output $D_{OUT}$. This, in the disclosed embodiment, is a serial output such that some type of parallel/serial conversion is required.

In general, by incorporating both the data conversion operation and the frequency domain transformation circuit in the same monolithic circuit, a single measurement module is provided wherein the functions of a data converter and a processing circuit are incorporated into a single monolithic solution, which processing circuit can incorporate the functions that are normally associated with DFT-type calculations. As will be described hereinbelow, this is facilitated without requiring the full capability of a DSP.

Referring now to FIG. 3, there is illustrated a block diagram of the basic operation of integrated circuit 202. The data converter 203 receives the input signal on line 207 and then converts it to sampled digital output values on the bus 209. This data converter can be realized with a delta-sigma converter, a SAR converter or similar type converter which will provide on the output thereof a sequence of digital words. These digital words are then received by a TD/FD transform engine 301 which is operable to perform DFT calculations. This DFT calculation is typically performed on a block of N input samples at a user specified or hardware specified block start time. Typically, transform engine 301 will require some type of instruction set in a block 303, which instruction set provides the information required by the transform engine 301 to perform the various calculations. Typically, this instruction set is separate from the engine 301, but it can be integrated into the transform 301 in the form of a hardware operation. The transform engine 301 typically operates at a different speed than the data converter 203, since the data converter 203 typically operates under the control of a sample clock at a sampling frequency $f_s$. The data converter 203 provides data at the sampling rate of the sample clock to the transform engine 301 for processing thereof at the processing speed of the transform engine 301. The transform engine 301 will typically provide an output therefrom a finite time after receiving the sampled data from the output of the converter 203. This can therefore result in some delay between the sampled data received from the converter 203 on bus 209 and the frequency domain data output from the transform engine 301 on a data output line 305. It is noted that the transform engine 301 need not be synchronized with the sample clock; rather, the only requirement is that a block of N samples be processed.

Referring now to FIG. 4, there is illustrated a more detailed block diagram of the integrated circuit of the present disclosure. The analog input signal received on the analog input 207 is input to the data converter represented by data conversion section 203. This data conversion block 203 is represented by an analog/digital converter 401 which is operable to provide the basic conversion of an analog signal to a digital signal. Once converted to sampled digital signals, this sampled digital signal can then be processed in the time domain. This processing is represented by a block 403 which can be any type of digital processing. This digital processing, for example, could be filtering in the form of a filter, as described hereinabove with respect to FIG. 1. Alternatively, it could be any type of digital processing that is required to be performed in the time domain as a precursor to the frequency domain transform process. For example, windowing techniques can be utilized to avoid spectral leakage problems. This is defined in Frederic J. Harris, "On the Use of Windows for Harmonic Analysis with the Discrete Fourier Transform," Proc. IEEE, Vol. 66, No. 1, January 1978, pp 51–83. The A/D converter and the time domain digital processing section 403 are referred to a sample clock 404. This sample clock generates the clock signal $f_s$ which is utilized for the sampling operation, wherein the input analog signal $A_{IN}$ is sampled and converted to a digital signal, there being one digital output for each sample. The processing of the digital processing section 403 then operates on each of these samples.

The output of the A/D converter 201 can be output on a bus 405 to a parallel/serial converter 407 to provide a time domain output from A/D converter 201. The output of the processing section of the time domain digital processing section 403 is provided on the output of a bus 409 to a parallel/serial converter 411 to provide a processed time domain output. Again, this processing can be either mere filtering, some type of pre-processing in the time domain for the frequency domain transform process or a combination thereof.

Once the time domain information has been processed, it is output on the bus 409 to the input of a frequency domain transform process engine 415, which is substantially the same as engine 301. The frequency domain transform process engine 415 receives each of the digital sampled outputs in the time domain on bus 409 from the converter section 203. A sequence clock 419 is provided for controlling the operation of the frequency domain transform operation. With some transform algorithms, the data input thereto may have to be stored in some type of elastic storage device. The sequence clock 419 basically determines in what sequence the various multiplications and accumulations are to be carried out for the DFT algorithm or even the DFT operation. The DFT operation, as described hereinabove, operates on a block of samples. For example, the resolution of the DFT is the ratio of sampling frequency $f_s$ to the number of samples N. If the sampling frequency were 100 kHz and the number of samples N were equal to 1024, then the frequency resolution would be approximately 100 Hz. For this resolution, it would be required that 1024 samples be processed in a given block to provide the frequency information regarding those 1024 samples. This would provide frequency information for each 100 Hz increment or "frequency bin." The sequence clock requires some type of block start signal in the form of an input on an input line 421 which defines the start of the block, and the sequence clock 419 having knowledge as to the number of samples in the block. This is different than the requirement for the converter section 203, in that converter section 203 does not require any information as to the number of samples in the block.

Typically, the DFT algorithm will operate on a block of samples which will then provide frequency information in various "bins." These frequency bins are generated such that one is generated for each input sample output from the data converter 203, this being described in more detail hereinbelow. However, as also described hereinbelow, it is not necessary to output all of the information stored in the frequency bins which is generally calculated by the DFT algorithm. This will be the result of some post processing operation.

The output of the transform processor engine 415, which is comprised of the frequency information in the various bins, is output on a bus 425 and can be input to a parallel/serial converter 428 for direct output thereof as a serial digital value. This therefore provides serial output information as to the various binned information. Typically, this can be an addressable location, as will be described hereinbelow. The bus 425 is also input to a post processor 427, which post processor 427 can perform certain operations on the binned information output by the transform processor 415. This will provide frequency domain process output information on an output 429 through a parallel/serial converter 431.

The post processor 427 allows a user to basically perform certain operations on the binned frequency information. For example, it may be that all the information required by the user is merely magnitude information from a few bins. In situations where the input/output (I/O) bandwidth is a concern, calculating, post processing, and outputting only a subset of the total number of frequency bins may be desirable. This can be programmable through the user program block 437 which receives an external program signal on a line 439 or the programming can be provided at a mask level. As such, binned information can be processed to provide less than all the binned information output therefrom. This is advantageous in that it may not be necessary to perform all the calculations necessary for complete analysis of the frequency content. For example, it may be that all the information that is required by the user is merely magnitude information from a few bins.

Although the time domain processor 403, the transform block 415 and the post processor 427 have been disclosed as utilizing separate processing engines, two or all of these functions could be performed by a single processing engine.

Referring now to FIG. 5, there is illustrated an even more detailed block diagram of the integrated circuit of the present disclosure. In this embodiment, the digital processing section 203 is comprised of A/D converter 401, which has the output thereof input to a digital filter section 501, the output of the digital filter section input to a time domain processing section 503. The digital filter section 503 is basically associated with the A/D converter section 401 in that it provides filtering in the time domain. The time domain processing section 503 is primarily a pre-processing section for pre-processing the digital data input to the frequency domain transform block 415. The output of the digital filtering section 501 can be provided as a separate output from a bus 507 to a parallel/serial converter 509 to provide a digital output of the partially processed time domain information in the digital domain.

The timing information is generally provided by a master clock 511 which is operable to generate a master clock signal. This can be divided by divide circuit 513 to provide a sampling frequency $f_s$. However, the sequencing operation provided by the transform block 415 is not necessarily synchronized with the sampling clock. As such, an analog phase lock loop (APLL) 514 is provided to give a multiply operation and scale the master clock up in frequency, followed by a digital phase lock loop (DPLL) 515 which is provided for functions such as digital noise management. Again, there is a block start operation that must be provided for the transform block 415.

The frequency domain output of the transform operation can be stored in frequency bins 519 which are addressable locations in the integrated circuit. These can be directly output through a parallel/serial converter 521, which basically allows for addressable selection thereof, the addressing operation not illustrated. The output of the transform block 415 is input to the post processor section 427 to allow direct post processing thereof, with the results thereof storable in the memory 519. Alternately, each of the binned values stored in memory by the transform block can be input to the post processing section 427 for processing thereof, the output thereof input to a parallel/serial converter 431. This post processing section 427, since all of the frequency information is collected and stored in the bins, can process any amount of this information to provide an output in accordance with a pre-determined post processing algorithm. It is noted that this post processing algorithm need not require all the frequency bin information to be stored. As such, this will reduce the amount of storage required, and also possibly reduce the amount of processing required by the transform block 415.

Since the entire string of processing for the time domain and the frequency domain is contained on a single integrated circuit chip, this removes the requirement for an I/O interface between two chips. As such, it can be seen that the various bus widths can be increased internal to the chip and then decreased or truncated for output therefrom. For example, the A/D converter could be realized with a SAR to provide a 12-bit output. The digital filter section 501, in order to maintain the resolution of A/D converter 401, could be operated at 16-bits to provide on the output there of a 16-bit output on bus 507. This 16-bit output could then be processed through a time domain process block 503 which could process at the 16-bit data width or even wider. This same 16-bit output or wider data width could be output on the bus 409 to the transform block 415 without requiring any truncation or subsequent processing to account for I/O considerations. This direct output can be input to the transform block 415, which in and of itself could require wider data paths for the processing. This data path can be output directly into the frequency bins or be truncated before input to the frequency bin. This, in general, will allow the system to maintain the wider internal bus width and maintain the data resolution of the A/D converter 401.

Figure 5A:
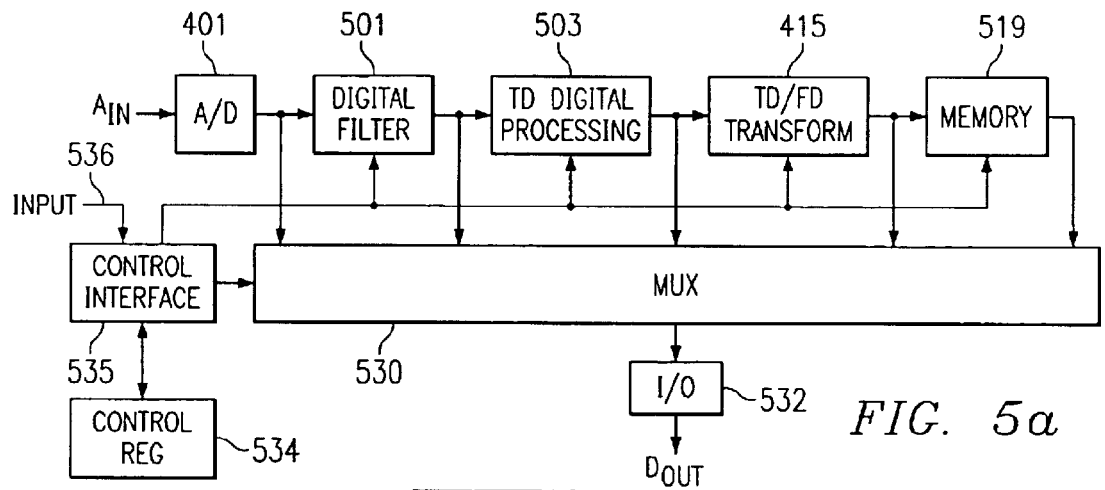
FIG. 5a illustrates an alternate embodiment with a multiplexer.

Referring now to FIG. 5a, there is illustrated an alternate embodiment of FIG. 5 wherein a multiplexer 530 is provided. The multiplexer 530 is operable to receive the output of each of the process blocks, the A/D converter 401, the digital filter 501, the timing domain processor 503, the TD/FD transform block 415 and the memory 519. These outputs are input to the multiplexer 530, one of which is selected for processing through an output interface block 532 to provide a single pin output. Therefore, with a chip having a single analog input and a single digital output, various processing functions can be provided with the output representing values in the time or frequency domains. This can be, of course, for the purpose of selective processing, or it could be for the purpose of diagnostics. This diagnostic mode would allow the user to determine process information at each stage of the process.

In order to control the overall operation of the frequency domain integrated circuit described hereinabove, a control interface 535 is provided. The control interface 535 is interfaced with a multiplexer 530 and all of remaining blocks in the system, the digital filter 501, the time domain processor 503 and the TD/FD transform block 415, in addition to the memory 519. In general, the control interface 535 allows the user a single port or pin by which to control various aspects of the system. A control register 534 is provided which is interfaced with the control interface 535 for storing control parameters that are associated with the operation of the integrated circuit. This allows a user to both provide commands through the line 536 to control the operation thereof and also allows data to be downloaded to the control register 534 or extracted from the control register 534. This control interface 535 therefore provides a "common control interface" for the overall chip in the form of the data converter portion for providing digital data in the time domain and the frequency domain translator portion. This is to be compared to previous systems that require multiple chips and separate control interfaces therefore. As such, less control pins will be required for a totally integrated solution by utilizing a common control interface. Only one interface is required in addition to the user only requiring to have knowledge as how to interface with this single interface.

Figure 5B:
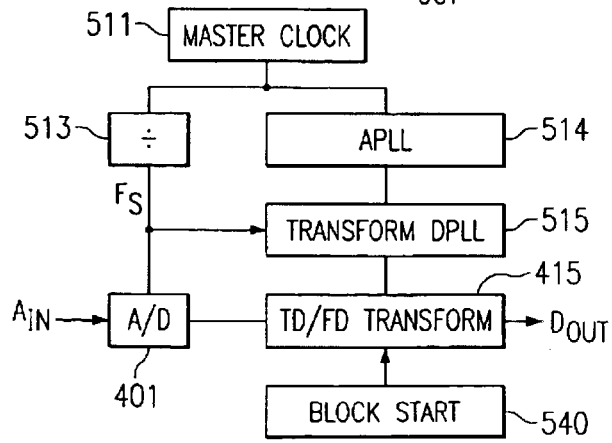
FIG. 5b illustrates a detail of the timing operation.

Referring now to FIG. 5b, there is illustrated a more detailed block diagram of a clocking operation. In general, the master clock 511 provides an output at a defined frequency period. Typically, this is a crystal controlled output. Since it is crystal controlled, designers would prefer to use a relatively inexpensive and easily obtainable crystal. This results in a relatively low frequency crystal. Since the digital processing operation is performed at a substantially higher clock rate than that associated with conventionally available crystals, the master clock frequency at block 511 will be multiplied with the use of an analog phase lock loop (APLL) 514. To allow for some digital domain "quiet time" immediately prior to analog sampling, the DPLL 515 will be utilized to provide a digital transform clock to the transform block 415. In addition to the transform clock, as described hereinabove, there is required a block start operation, as indicated by a block 540. This will be described hereinbelow.

Figure 6:
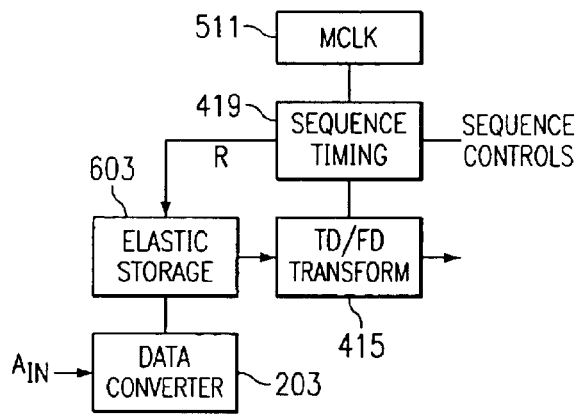
FIG. 6 illustrates a simple block diagram showing the elastic storage interface between the A/D converter and TD/FD transform block.

Referring now to FIG. 6, there is illustrated a block diagram of an example interface between the data conversion section 203 and the transform block 415. This is in the form of an elastic storage device 603. This elastic storage device 603 requires the data to be sampled at the sample rate of the sample clock $f_s$ in data conversion section 203. The actual calculation or sequencing of the transform block 415 is not necessarily synchronized with the sample clock. However, it is noted that the number of output values is less than or equal to the number of samples input for a given block size. If the block size, for example, were 1024, then there would be 1024 outputs provided, this being the resolution of the DFT algorithm. However, the data is not necessarily required by the transform block 415 at uniform intervals, and therefore, the elastic storage block 603 will be required. This elastic storage block 603 will be controlled by the sequence clock 419 which will generate a Read signal for the storage block 603 for input into the transform block 415. It is noted that the elastic store of FIG. 6 can be located anywhere within the process chain. It could be part of transform block 415 or part of any of the previous time domain processing sections in the chain. Further, some elastic storage can be provided on the output of the transform block 415.

Figure 7:
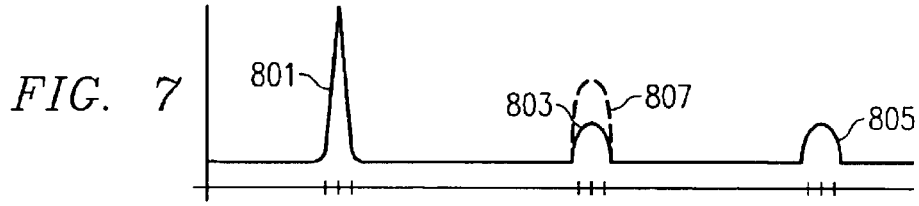
FIG. 7 illustrates an application of the TD/FD transform operation.

Referring now to FIG. 7, there is illustrated a plot of the frequency output for a given application, such as measurements of a rotating system. The rotating system has a fundamental operating frequency 801 which would represent the resolutions per minute (RPM). This would also have harmonics, a second harmonic 803 and third harmonic 805 and subsequent harmonics thereafter (not shown). It may be that a distortion would be desirable to measure (as an example of bearing wear, for example) or even a variation in the fundamental frequency. From a distortion standpoint, all that will be required would be to look at the relative amplitude of one of the harmonics. In the frequency domain, this is a relatively easy thing to do in that the second harmonic 803 can be measured over time and then the magnitude thereof compared with the previous magnitude. If there is a change in the magnitude, this would indicate some type of distortion. This would be virtually impossible to detect in the time domain, as very small changes are difficult to measure from a distortion standpoint, whereas the frequency domain facilitates such a measurement. This would be illustrated as a change in the output of the second harmonic, illustrated by phantom line 807.

Figure 8:
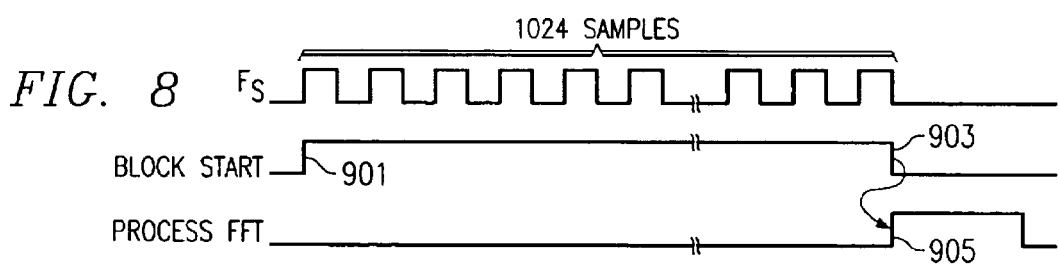
FIG. 8 illustrates a diagrammatic view of the block start signal and the sampling frequency.

Referring now to FIG. 8, there is illustrated a timing diagram illustrating the sampling frequency and the block operation. As described hereinabove, the transform operation requires N samples over which the transform is performed, i.e., there is a block of samples required to perform the transform. There is illustrated the sampling clock $f_s$ which basically provides for a predetermined number of N samples—in this example 1024 samples. A block start is initiated at an edge 901 and proceeds to an edge 902 which basically collects the samples. Different frequency domain transforms facilitate situations wherein certain of the calculations required thereby can be performed concurrently with the sample gathering for a given block of samples, i.e., prior to the time that all the samples are gathered for the given block. Thus, different transform algorithms may yield different amounts of pipelined delay before the frequency domain results are available.

The transforms described hereinabove were the DFT and the FFT transforms. However, there were many other transforms that can be utilized in transforming a time domain value to a frequency domain value. These transforms can result in significantly less calculations. For example, the Goertzel transform is a transform that allows the transform to be carried out for a single bin with a relatively simplistic algorithm. This requires a very small number of clock cycles in order to perform this operation. This algorithm is described in Goertzel, "An Algorithm for the Evaluation of Finite Trigonometric Series," American Math Monthly, 65, pp. 34–35, January 1958, which reference is incorporated herein by reference. Therefore, if only the information for a single bin were required, the Goertzel algorithm would be sufficient and this algorithm could easily be facilitated in a hardware application. Further, since the Goertzel algorithm is relatively straight forward, it would be relatively easy to change to a different bin number.

Figure 9:
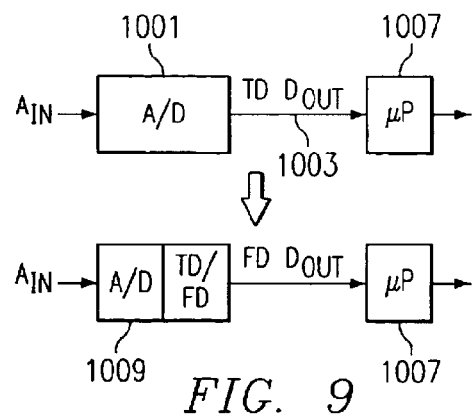
FIG. 9 illustrates a diagrammatic view of an upgrade operation.

Referring now to FIG. 9, there is illustrated an overall system operation wherein a prior art system is upgraded to the current apparatus. In the prior system, a time domain data converter 1001 is provided for converting an analog input value to a time domain digital output value on a line 1003. This is received by a microprocessor 1007. In a situation where a designer wanted to process information in the frequency domain or make decisions in the frequency domain, this would then require the microprocessor to receive the time domain digital output and apply additional processing thereto. Typically, in an application wherein the time domain digital output were processed, this would require significantly more processing power, the significantly more processing power (and/or programming) required to perform some type of transform from the time domain to the digital domain. By upgrading the system to a data converter 1009 having the ability to provide the data conversion in the time domain and then convert the information to the frequency domain, the frequency domain output can then be utilized for processing with the same microprocessor 1007. The instructions required therefor would be minimal to upgrade the operation. Therefore, by utilizing the device of the present disclosure, frequency domain processing can be provided without requiring any upgrade in the processing section. This will be desirable from a designer standpoint in that the complexity of programming the microprocessor 1007 would, in and of itself, facilitate a much nicer design.

Figure 10:
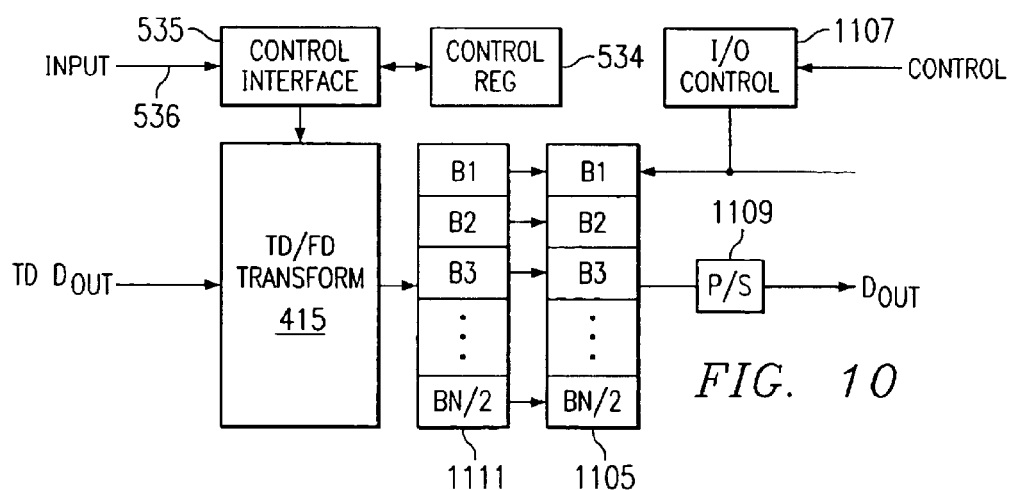
FIG. 10 illustrates a block diagram of the user programmable operation of the time domain/frequency domain transform block 415.

Referring now to FIG. 10, there is illustrated a block diagram of the configure operation wherein the user can program the operation of the transform block 415. In general, the transform block 415 will be a processing unit that will perform calculations in accordance with the predetermined frequency domain transform algorithm. However, there are some parameters that can be applied to the transform to alter the operation thereof. For example, in the Goertzel transform, there can be some type of address shift such that the particular bin that is calculated is definable by the user. This is facilitated through the use of the configuration interface 535 which can receive input information on line 536. This allows the user to externally input certain configuration information. This provides a more versatile system.

The output of the transform block 415 can then be input to one of multiple bins 1105. It may be that the integrated circuit is designed to only perform calculations for association with certain bins or provide all N/2 bins, each bin storing a real and imaginary part. If multiple bins are provided, there is some type of addressing that is required which is provided by an input/output control block 1107. This receives a control signal external to the system to select a bin for output therefrom. Further, there could be a situation wherein the bins are sequentially output and the control block 1107 would control such output. These are then processed through a parallel/serial block 1109 and then provide a serial output. This type of output is conventional. Typically, whenever dealing with this type of storage, there would typically be provided two memory storage locations, one for the output bins 1105 and an additional block 1111 for the accumulation operation. In general, each of the bins must be subject to an accumulation operation during the processing and then the final output latched over into the bin memories 1105.

Figure 11:
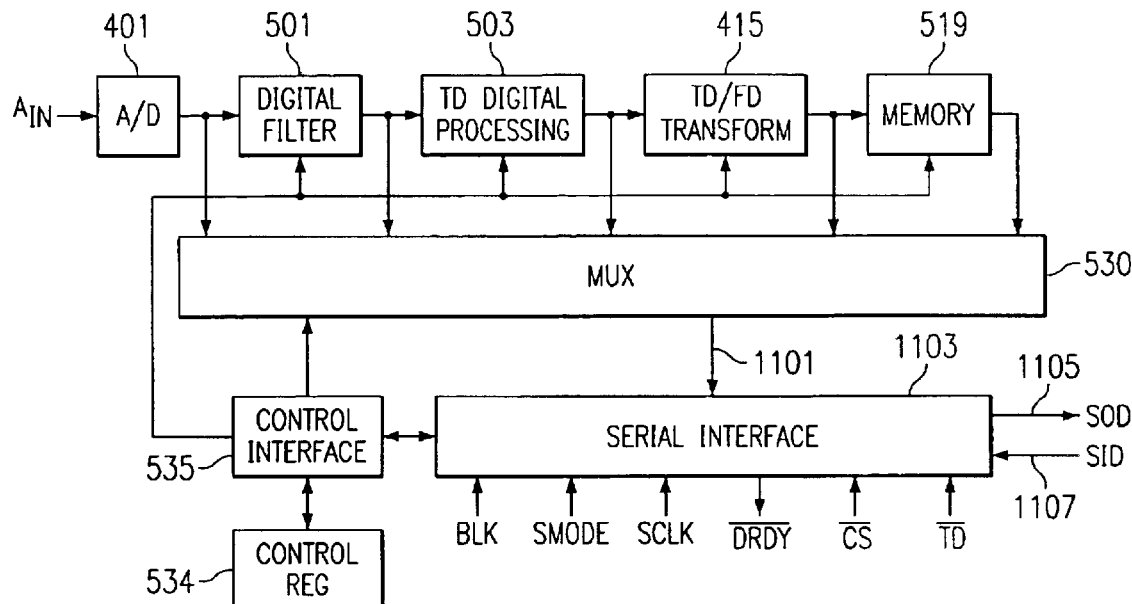
FIG. 11 illustrates a block diagram of an embodiment utilizing a serial interface and the data-ready feature.

Referring now to FIG. 11, there is illustrated an alternative embodiment of the above-disclosed time domain/ frequency domain converter of FIG. 5a, wherein like numerals refer to like parts in the various FIGURES. As described hereinabove, the multiplexer is operable to select the output form of the multiple processing sections, the A/D converter section 401, the digital filter section 501, the time domain processing section 503, the TD/FD transform section 415 or the memory section 519 and provide a single output on a line 1101. This, with reference to FIG. 5a, is output to the I/O block 532 in order to provide a digital output. In the embodiment of FIG. 11, this output line 1101 is input to a serial interface block 1103. The serial interface block 1103 basically functions as the I/O block 532 except that the serial interface block 1103 provides for a data-ready-Bar (DRDYb) signal and associated operation, as will be described hereinbelow. The serial interface block 1103 also provides the ability to receive the block start signal (BLK), a serial mode signal (SMODE), to select various signal modes (which will not be described herein), a serial clock input (SCLK), a chip select-Bar signal and a time domain/ frequency domain select (TD-Bar) signal. The TD-Bar signal selects time domain operation when low and frequency domain operation when high. Serial output data is provided on an output line 1105 and serial input data is provided on an input line 1107. The serial output line 1105 provides serial output data (SOD) when the appropriate node is selected and the serial input line 1107 provides for receiving serial input data (SID), which is utilized to write to the internal control register 534 controlled by the control interface 535, as described hereinabove. In general, the operation of the serial interface 1103 is conventional and a representative description of such an interface is described in the data sheet DS 74F1 for the CS 5516 16-bit/20-bit Bridge Transducer A/D Converter manufactured by Cirrus Logic, which data sheet was copyrighted in 1997 and which is incorporated herein by reference. The serial interface 1103 provides for writing to the control register 544, which is a register for storing configuration information and command information. Overall, the functions carried out by the integrated circuit are effected through the use of an on-chip controller that manages the overall operation of the integrated circuit, and which functions a re illustrated in the separate processing blocks. The on-chip controller incorporates various registers associated with the operation of the device. Typically, when power is applied, and the device has been reset via a reset input (not shown), the serial port 1107 is initialized into the command mode. In this mode, the integrated circuit is waiting to receive a control word via the serial port 1107. Whenever a new word is written into the configuration portion of the control register 534, the on-chip controller will then decode the word and execute the configure register instructions via the control interface 535. Typical configurations are such functions as adding offset, subtracting offset, providing a percentage of offset or selecting frequencies, placing the system in a sleep mode or taking it out of a sleep mode, calibrating the part, etc. These are all described in the data sheet for the CS 5516, in Table 2, all of which have been incorporated herein by reference. However, it should be understood that the CS 5516 is a time domain device and, therefore, additional information other than that set forth in the data sheet for the CS 5516 will be required for operation between the frequency domain and the time domain and also for configuration of the multiplexer 530. Other than these additional functions, the use of a configuration register and a command register in an overall control register in conjunction with the operation of the part is normally found in a time domain data converter, and is equally applicable to the frequency domain with additional functionality added.

Figure 11A:
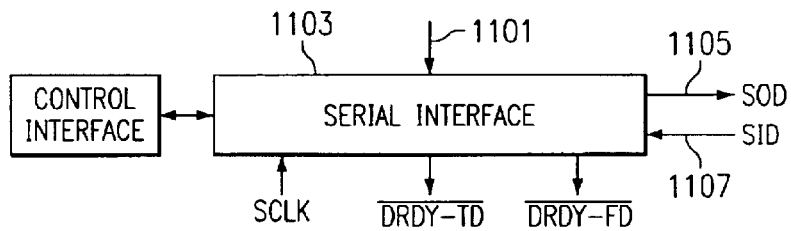
FIG. 11a illustrates a detail of the data-ready signal pins utilizing two pins, one for time domain and one for frequency domain.

Referring now to FIG. 11a, there is illustrated a modification of the embodiment of FIG. 11. In FIG. 11a, the serial interface 1105 provides two data-ready bar outputs, one for time domain, DRDY-TDb, and one for the frequency domain, DRDY-FDb. In this manner, a separate data-ready bar terminal is provided for indicating to a user whether the time domain output is ready or the frequency domain output is ready, then allowing the user to retrieve the appropriate information. Although illustrated as having a single serial output line 1105, the serial interface 1105 could actually provide for two separate serial outputs, one for the time domain and one for the frequency domain, as set forth hereinabove.

Figure 12:
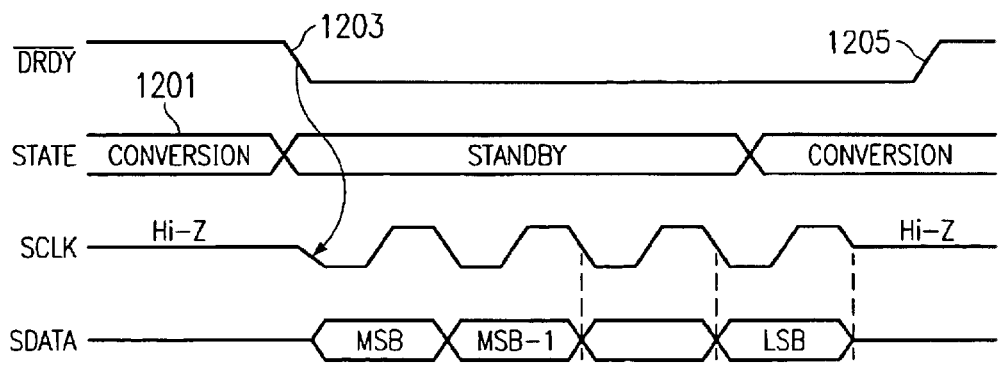
FIG. 12 illustrates a timing diagram for outputting a conversion result in the time domain.

Referring now to FIG. 12, there is illustrated a timing diagram for the operation of the serial interface 1103 in the time domain, i.e., whenever any information is extracted by the multiplexer 530 from the A/D converter 401, digital filter section 501 or the time domain process section 503. This is generally conventional as set forth in the data sheet for the CS 5505/6/7/8 A/D converter manufactured by Cirrus Logic, Inc., which data sheet was published in 1997 under Data Sheet DS 59F4, which is incorporated herein by reference. This part CS 5505 utilizes a serial interface logic which basically requires a chip-select signal (CS-Bar), a DRDYb signal, a serial clock and a serial data output. Specific reference is made to FIGS. 2, 3 and 4 therein.

Referring further to FIG. 12, there are provided two states during the time domain operation, a conversion state and a standby state. There could also be provided a calibration state, which is not illustrated. In general, whenever the conversion state is initiated, this being in response to a conversion pulse or some other input, a conversion operation is initiated. This conversion state, as noted, can be entered at the end of the calibration cycle, or whenever the converter is idle in the standby mode. The system can be set for a single conversion or can be set to perform continuous conversions on the input signal. Additionally, although not shown, there can be multiple inputs provided which can be selected by an input multiplexer (also not shown). There will be a predetermined number of clock cycles required for the conversion during a conversion time 1301. There may actually be two additional input clock cycles required, one initiating the conversion from the standby state and one as to when the conversion actually begins. This is due to internal logic aspects, which will not be described herein. At the end of a predetermined number of clock cycles required for the conversion, the DRDYb signal will go low at a transition 1303. This provides an indication that the serial port has been updated and the associated register has been written. It is important to note that, when the DRDYb signal goes low, the previous data in the serial port will be overwritten, this being from a previous conversion cycle. When the DRDYb signal goes low, this is recognized by the operating system which generates the serial clock on the SCLK input which then goes from a high impedance state to a low impedance state while clocking the data. This data is clocked out, such that all of the bits from the MSB to the LSB are clocked out of the serial point. At the end of the time provided for data to be clocked out, the DRDYb signal will go high in a transition 1305 and then wait for the end of the next conversion. It is noted that, during the serial output of the data, another conversion can take place. It is only important that all of the serial data be clocked out prior to the end of a given conversion cycle, such that the serial port register can be overwritten. Again, this is a conventional operation for the time domain.

Referring now to FIG. 13, there is illustrated a flowchart depicting the use of the DRDYb signal with respect to conversion in the frequency domain. By comparison to the time domain, the frequency domain operation requires a conversion of a block of samples with the output thereof provided after complete conversion of a given block is completed. The system is initiated with a BLK signal going from a low to a high at a transition 1301. This initiates the conversion operation wherein N samples are acquired for a given block. This is initiated from the standby mode, as represented by a mode 1303 which then proceeds to a conversion/transform operation in a region 1306. The conversion/transform operation is one wherein analog data is converted to digital data and processed through the frequency domain transform algorithm. Typically, this transform operation can partially be carried out as each sample is converted to a digital word. However, at the end of the N samples, the conversion operation will cease and the remainder of the transform algorithm will be carried out. This is represented by a region 1308, which transform region basically represents a transform delay between the last sample and the completion of the entire transform. This transform region 1308 can include any post-transform operations, such as calculation of the magnitude. This, of course, is application specific, the important aspect being that the necessary calculations or computations be completed prior to providing an output therefrom.

At the end of the transform delay provided by the transform region 1308, the DRDYb signal is taken from a high to a low as represented by transition 1310. This will initiate the data-ready mode. In the data-ready mode, there will be a plurality of registers or "bins" that will contain information pursuant to the transform operation. Each of these data words must be read out in a serial manner through the serial port 1105. This will require the serial clock SCLK to clock the data for each of the available output digital values, as represented by a first digital value 1313, a second digital value 1314 and Mth word 1316, there being potentially a plurality of available output digital values therebetween. Of course, if only information regarding three bins was required, then only three digital values would be required for the output.

Once the final digital value has been output, the word 1316, the DRDYb signal will be raised high, as indicated by transition 1318. The next BLK rising edge will initiate collection of time samples for the next block. However, there is a standby region 1322 disposed between the transform region 1308 and the next conversion/transform operation. It may be that the next conversion cycle can be performed prior to reading out all of the data. This is due to the fact that the output will typically be double buffered. However, the only important fact is that the actual output register that is being read on the serial output port is not over written by result of the next transform operation. Any sequence of timing signals can be provided with various buffer outputs to provide a pipelining of these operations to minimize the time between one transform and the next. Further, it is noted that the timing diagram for FIG. 13 is not to scale and that the actual serial clocking of the data out from the serial interface 1103 can occur very rapidly in just a few sample times or even within a single sample time, such that the standby region 1322 is very small. The system can be set for a transformation of a single block (returning to standby mode when the block is completed) or can be set to acquire and transform blocks on a continuous basis.

Referring now to FIG. 14, there is illustrated an alternate embodiment of the timing diagram of FIG. 13. In this embodiment, each of the data words is clocked out separately with the SCLK signal. Therefore, for the first data word, the data word 1312, a DRDYb transition 1402 initiates the clocking of the first word 1312 out from the output serial port 1105. The end of this serial output operation, the DRDYb signal is taken high, by transition 1404 and then low again by transition 1406 indicating the output of the next data word 1314. This will continue on until the last data word 1316, resulting in a transition 1410 of the DRDYb signal going high. This requires that the configuration register be pre-loaded with a predetermined list of desired frequency domain outputs. However, it should be understood that any combination of multiple data words for a given DRDYb transition and single words could be utilized. It is only necessary that this DRDYb transition occur after a complete transform operation has occurred. This operation will be provided primarily by the configuration controls wherein certain bits can be set in the configuration register.

Figure 15:
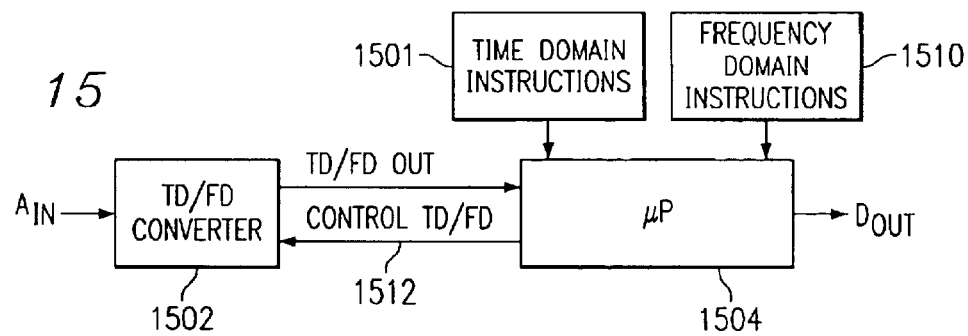
FIG. 15 illustrates a block diagram of a system interfacing the converter of the present disclosure with a microprocessor section.

Referring now to FIG. 15, there is illustrated an overall block diagram of the time domain/frequency domain converter, represented by a single integrated circuit 1502, interfaced with a microprocessor 1504. The microprocessor 1504 provides multiple functions, but it operates to receive either time domain information or frequency domain information. With time domain information output by converter 1502, certain instructions will be required which will be stored in a time domain instruction region 1506. This will allow the microprocessor 1504 to be configured such that time domain information is received from the converter 1502. When frequency domain information is received from the converter 1502, then frequency domain instructions in region 1510 will be utilized by the microprocessor 1504 in carrying out its functions.

In order to interface with the converter 1502, the microprocessor is provided with a control interface line 1512 which will allow information to be transmitted to the time domain/frequency domain converter to select the mode of operation, i.e., operating in the time domain or operating in the frequency domain. This can be facilitated in a number of a ways. First, a configuration word can be loaded into the configuration register after a reset operation has been initiated of the converter 1502. This could be a bit that sets it in one or the other of the domains. Further, this control in the form of one or more configuration bits can set the state of the multiplexor 530 such that not only is the frequency domain or the time domain selected, but also the operation, i.e., it could be that the microprocessor 1504 would desire some post processing in the frequency domain as opposed to just merely examining certain bins. This could be selected therebetween. Further, in the time domain, the output of the A/D converter section 401 could be selected or the output of the digital filter section 501. This is merely selected by the configuration setting. Further, this control line 1512 could be a single input or single pin that could be pulled high or low for selecting the operation. This is illustrated in FIG. 11 wherein the serial interface 1103 has a single input TD-Bar. When high, the frequency domain is selected and, when low, the time domain is selected. It is noted that the microprocessor 1504 requires programming to allow the versatility of selecting this operation. Further, it can be seen that this is done with a single interface in the form of either a serial output for loading a configuration register or just a single pin. Of course, the microprocessor 1504 would need to interface with the converter 1502 in the frequency domain to provide other information such as the block start, which would not be required in the time domain.

Figure 16:
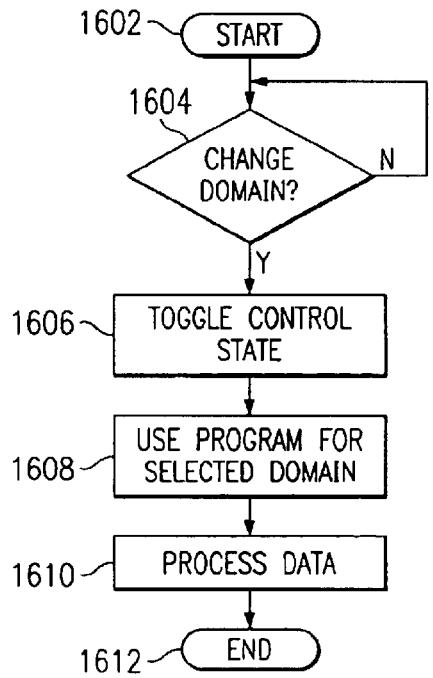
FIG. 16 illustrates a flowchart depicting the operation of changing from a time domain to a frequency domain operation.

Referring now to FIG. 16, there is illustrated a flowchart depicting the operation of the microprocessor for changing between modes. The program is initiated at a start block 1602 and then proceeds to a decision block 1604 to determine if the domain is to be changed between the time domain and frequency domain. If not, the program loops back upon itself and, if so, the program flows to a function block 1606 to toggle the control state and then to a function block 1608 to use the particular program instructions for the selected feature and the selected domain. The program then flows to a function block 1610 to process the data in accordance with the selected domain and the selected instructions and into an End block 1612.

Figure 17:
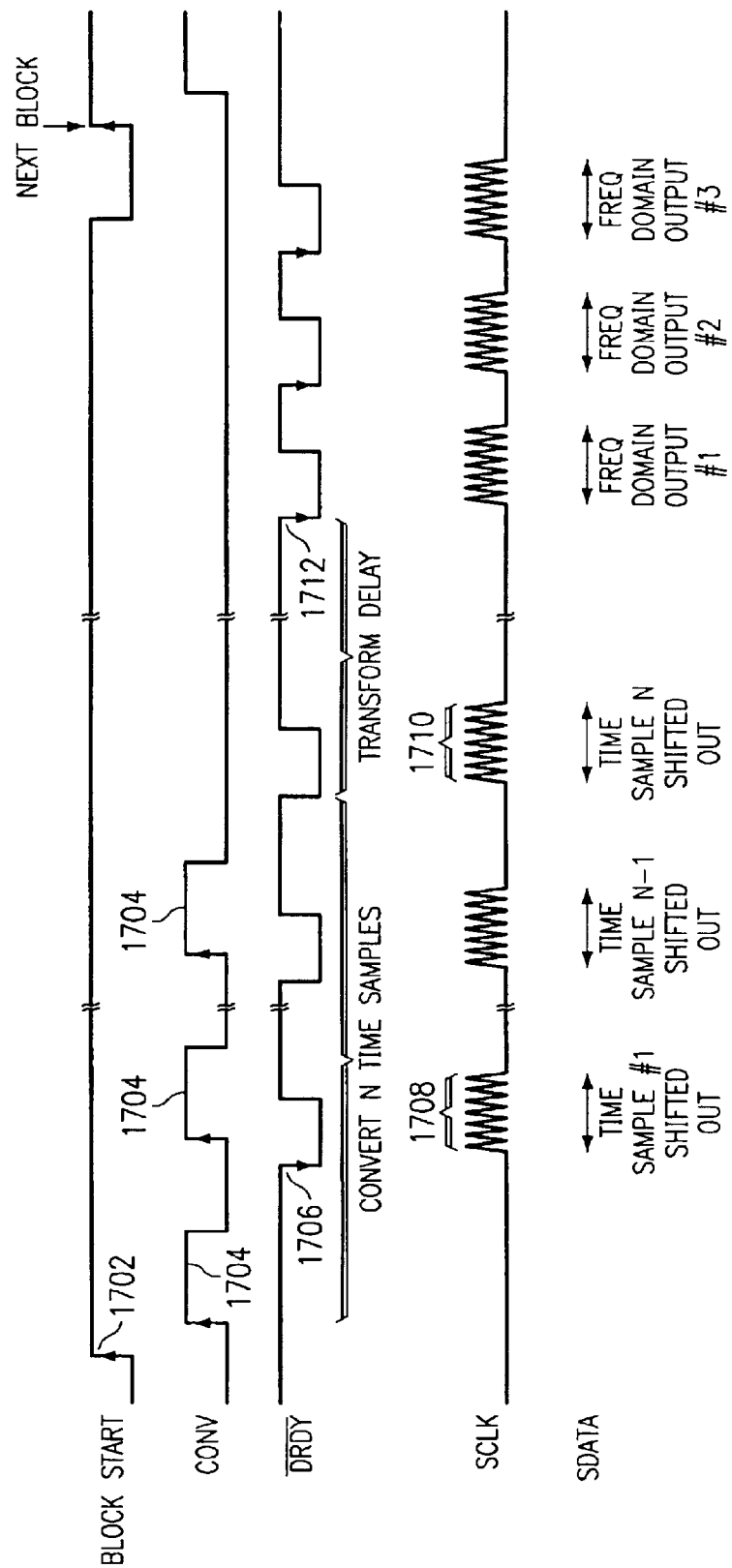
FIG. 17 illustrates a timing diagram for retrieving both time samples and frequency domain information during a single conversion/transform operation.

Referring now to FIG. 17, there is illustrated a timing diagram for an alternate embodiment of the present disclosure. In the embodiment of FIG. 17, the time samples from the time domain processor 403 and the frequency domain output from the frequency domain processor 415 can be selected therebetween. During the data conversion operation in the time domain, time samples are output as digital values in a continuous manner. A block of N time samples is defined from a BLK starting point and these N time samples operated on by the time domain/frequency domain transform block 415 to generate the frequency domain values which, as described hereinabove for N=1024, could be up to 1024 digital values for the 1024 bins. However, this frequency domain information is not present until the transform is complete, which occurs after receipt of all N time samples, although partial transforms can be performed at the receipt of each time sample.

In the embodiment illustrated in FIG. 17, during the transform operation, the resultant digital value of the conversion operation for each time sample can continually be shifted out, up to the resultant digital value of the conversion operation for the Nth time sample. Once the resultant digital values of the conversion operation for all the time samples have been shifted out, then the frequency domain information resulting from the transform operation operating on the block of N time samples can be shifted out, these values depending upon the transform algorithm, the amount of postprocessing performed, etc.

With specific reference to FIG. 17, the block start signal BLK is initiated at an edge 1702 and then the conversion begins with the data samples 1704 output for the N time samples. These time samples are processed by the time domain/frequency transform 415, which will be complete a predetermined transform delay after the last of the N time samples in the block has been received. When the conversion results for each of the time samples processed is complete after the block start signal has gone high at edge 1702 (or for select one of the time samples in the block), the DRDYb signal goes low at edge 1706 to indicate that the information associated with the results of the conversion operation on the first time sample 1704 is ready for output and the serial clock SCLK is allowed to retrieve the data. This will result in a serial clocking operation during a period 1708 associated with the first time sample. This will result in the results of the conversion operation for the first time sample being shifted out. Of course, this value is also being input to the time domain/frequency domain transform block 415. This continues for all time samples up to the Nth time sample at a serial clock period 1710 (or the results for only conversion operations on select time samples in the block can be output). After the results of the conversion operation for the last time sample has been shifted out, there will be a transform delay followed by the DRDYb line on low, as indicated by transition 1712. This will indicate that the frequency domain information is ready for output. The SCLK line will then be clocked wherein the data for the first frequency domain output value will be output, followed by the remaining frequency domain output values, there only being shown three frequency domain output values for exemplary purposes. Also the DRDYb signal is illustrated as going low for each bin output or frequency domain output value, it being understood that the DRDYb line could go low once for all of the frequency domain output values, the user then generating timing for the SCLK signal to sequentially output all of the appropriate information. It is important that the DRDYb signal provide information that can be utilized for both time domain and frequency domain information and that the multiplexer 530 can provide time domain information during periods when the time domain processor is processing the information, without interfering with the operation of the either operation through the appropriate internal data buffering.

Figure 18:
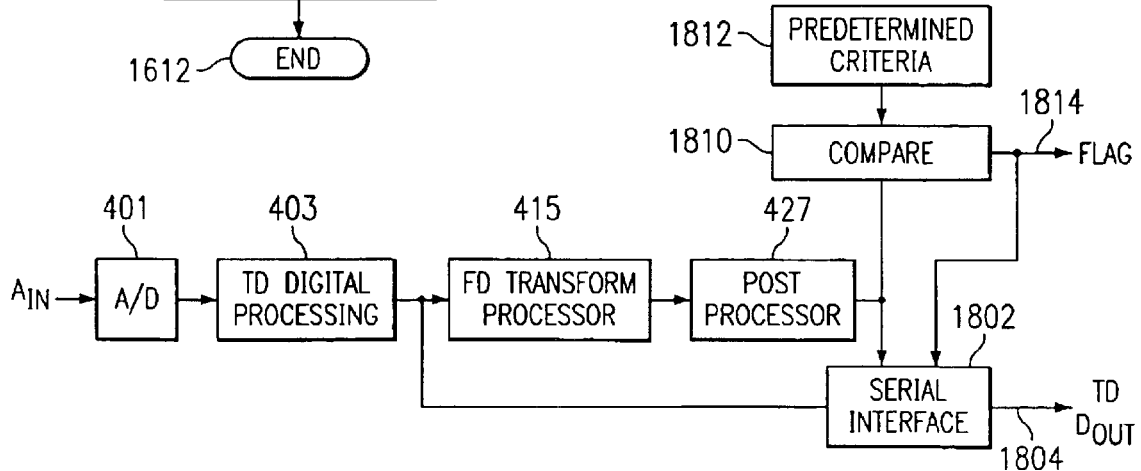
FIG. 18 illustrates an alternate embodiment of the disclosure for utilizing frequency domain processing in the background.

FIG. 18 illustrates an alternate embodiment of the present disclosure. In this embodiment, the A/D converter 401 and the time domain digital processing section 403 are operable to perform whatever processing is necessary in the time domain, as described hereinabove. This could involve any amount of post processing operations on the converted data in the time domain, these being the time sample data. Information in the time domain is output through a serial interface block 1802 to a serial output 1804. In general, this embodiment is a time domain data converter. However, the frequency domain transform processor 415 is included on the integrated circuit for the purpose of providing some predetermined background function in the frequency domain. One exemplary background function is to monitor a 6 Hz frequency component in the analog input signal, compare the magnitude of this component to an acceptable 60 Hz interference threshold, and then provide an error flag if the interference exceeds the threshold. The frequency domain interference monitor can run continuously in the background and concurrently with the normal operation of the time domain converter. The monitor is provided by the post processor 427.

The post processor 427, as described hereinabove, can perform any type of operations on the frequency domain information output by the transform processor 415 for a defined block of N time samples of the data being processed by the time domain processor 403. For illustrative purposes, all the clocks and control blocks have not been described in the Figure, they having been described hereinabove. This post processor 427 is operable to perform the predetermined post processing and generate some type of result in the frequency domain. This frequency domain result can be compared with a comparator 1810 with some type of predetermined criteria, which is pre-stored in a block 1812. This compare operation can generate a flag on a possible output pin 1814 from the integrated circuit or this can be sent back to the serial interface to control the serial interface to output the results of the post processor 427. This can be an interrupt-driven function wherein the flag provides an interrupt and then the data from the post processor 427 is read out. In the disclosed embodiment, the transform processor 415 is not operable to provide frequency domain output information as the primary function of the integrated circuit.

The frequency domain processor 415 may also be included on the integrated circuit for the purpose of providing a test mode for measuring the non-linearity of the A/D converter 401. In such a test mode, a distortion free sine wave is provided as the analog input to the integrated circuit, with harmonic distortion components monitored in the frequency domain. Defective integrated circuits with unacceptable distortion levels can be easily rejected utilizing such a test mode.

Figure 19A:
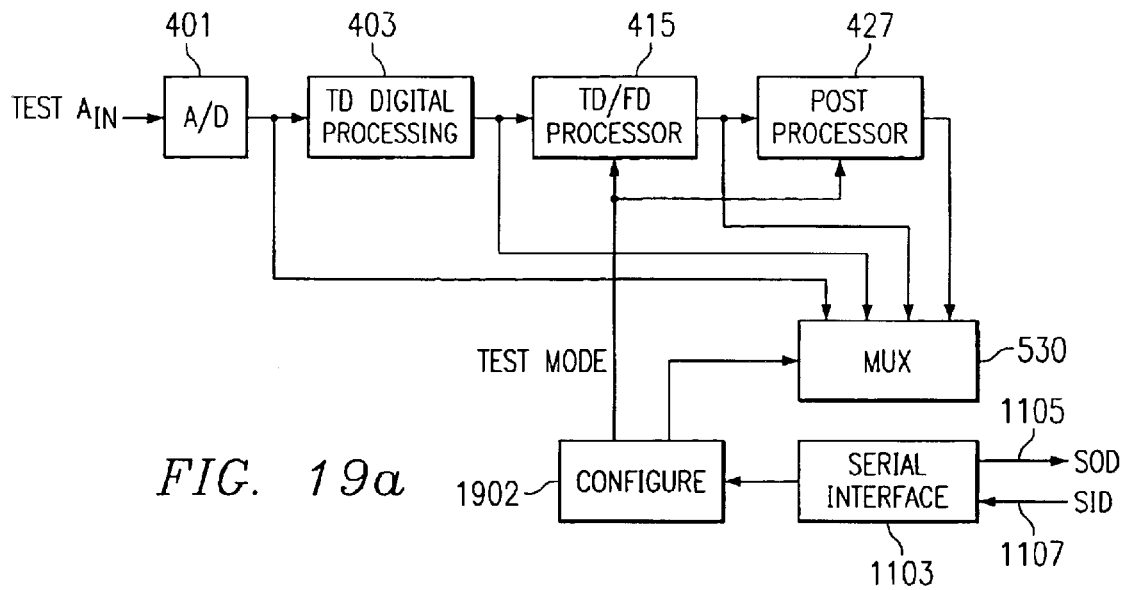
FIGS. 19a and 19b illustrate embodiments for a test mode feature.

Referring now to FIG. 19*a*, there is illustrated a simplified block diagram illustrating the test mode concept. In FIG. 19*a*, the integrated circuit is configured for both time domain operations and frequency domain operations. The various processing sections, the time domain processor 403, time domain/frequency domain processor 415 and post processor 427, are all interfaced with the serial interface 1103. In addition, there is provided a configuration block 1902, which represents the control interface 535 and control register 534, which is interfaced with the serial interface 1103. The configuration block 1902, in addition to controlling the multiplexer 530, also provides test mode control for the time domain/frequency domain processor 415 and post processor 427. When the system is not in test mode, the operation is as described hereinabove, i.e., there is information input thereto and digital information output therefrom in one of the select processing sections. However, in the test mode, the configuration block 1902 is operable to control the system to operate the frequency domain transform portion thereof in a particular test mode operation. As described in the example above, this could be utilized for measuring distortion. In this mode, there will be some type of control associated therewith to place the system in the test mode. This could be in the form of a configuration bit that is set in the configuration block 1902, in the control register 534 (not shown), which sets the test mode operation. Once in test mode, then a test analog input is applied thereto (such as a sine wave of a predetermined frequency) and the results stored in the control register 534 for later retrieval therefrom. Typically, this test mode is something that would be performed at the manufacturer's location and would basically be a "hidden instruction" as it applies to a user, i.e., it is not a documented test. However, this mode is a mode whereby the transform operation is a pre-determined and defined operation for primarily one purpose. It may be that the distortion is measured by comparing a fundamental frequency in one bin to the second and/or third harmonic level in another bin to measure distortion. Since the frequency of the sine wave is known, it is only necessary to examine a limited number of frequency bins in order to make a decision. There can be provided a comparator or some type of post processing operation in the post processor 427 primarily for the test mode such that the system need only set the bit in the control register for reading thereof, i.e., indicating fail or pass. Alternatively, the information could be extracted out of the post processor 427 with the multiplexer 530, in order to read a test result value. Once the test mode has been entered and the test performed, then the control bit can be set back to normal operating mode during chip test.

Figure 19B:
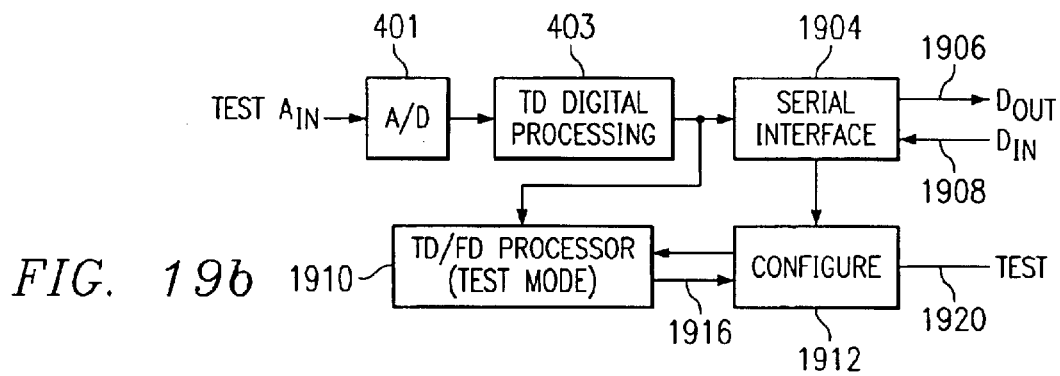

Referring now to FIG. 19*b*, there is illustrated an alternate embodiment wherein the integrated circuit is primarily utilized for time domain operations. As such, the A/D converter 401 feeds the time domain processor 403, which can perform a process such as a digital filtering operation, and then provide this result in the time domain for output to the serial interface block 1904, similar to the interface block 1103. This will provide a digital output in the time domain and allow for digital input on lines 1906 and 1908, respectively. The serial interface block 1904 is primarily utilized to retrieve information from the time domain processor 403 after the conversion operation in the time domain. However, there is provided a test mode wherein a separate time domain/frequency domain processor along line 910 is provided which is operable to perform a single task, that of obtaining frequency domain information for a test operation. In this operation, as described hereinabove, in the example, a defined sine wave is input to the A/D converter 401 and then a distortion analysis performed. The time domain/ frequency domain processor 1910 can be utilized at any time as it is a "background" processor. A configuration block 1912, similar to the configuration block 1902 in FIG. 19a, is provided which receives information from the input port 1908 to the serial interface block 1904 (or this can be an external pin that could be pulled high or low indicating a test mode) that allows a bit in the control register 534 to be set. Once set, this places the time domain/frequency domain processor into an operational mode, i.e., provides a block start signal, processes the information output by the time domain processor 403 and then generates a result. The processor 1910 can also do post processing such that only a single result is output on a line 1916 for input to the configuration register 1912 as a single bit. In this manner, there is provided a separate background processor for performing a single frequency domain function wherein time domain information is converted to the frequency domain to extract information in the frequency domain therefrom. This requires a predefined signal being input thereto and the time domain/frequency domain processor 1910 being rendered operational. This could always be an operating mode wherein the block start signal is continually generated, as this operation can be performed continually in the background. However, a user would typically want to disable this due to the power considerations.

In an alternate embodiment in FIG. 19b or FIG. 19a, there can be provided a test pin, which is only shown with reference to FIG. 19b. This test pin is referenced by a line 1920, which is an external pin that can be raised high or low with the configuration block 1912 recognizing such. Further, the time domain/frequency domain processor 1910, when operating, either in response to a configuration bit in the control register 534 for test mode or in a continuous manner, could provide an output on the test pin 1920 wherein the test pin would provide an output as opposed to receive an input control signal. Therefore, if a user inputs the test signal on the analog input, they need only examine the state of the test pin 1920 in order to determine if there is acceptable distortion. Other than the test mode, there would be no reason to utilize the test pin 1920. However, the preferred operation would be to run the test mode in the background only for the purposes of testing the chip during manufacturing, this being a non-disclosed function to the user.

Figure 20:
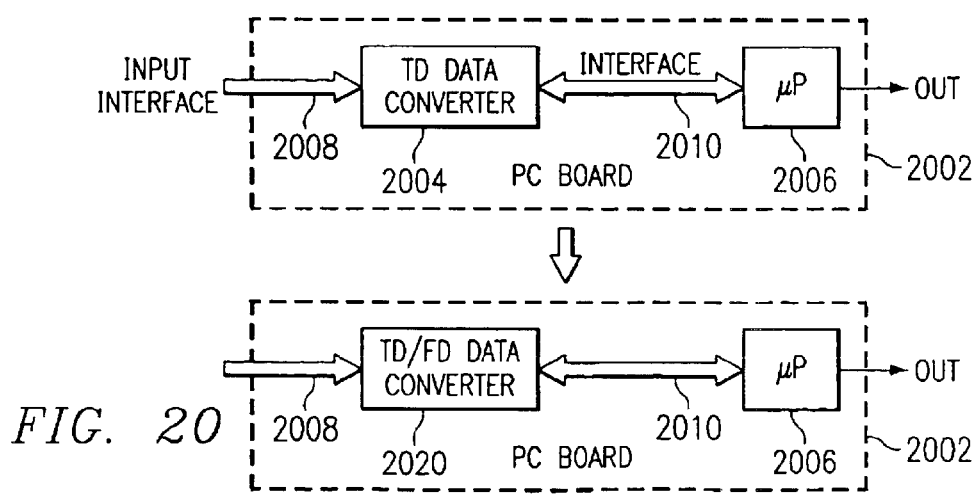
FIG. 20 illustrates a diagrammatic view of the board compatible operation between the time domain and the frequency domain data converter.

Referring now to FIG. 20, there is illustrated a block diagram of an alternate embodiment of the present disclosure illustrating a board compatible configuration wherein a time domain data converter and a time domain/frequency domain data converter can be interchanged with the a common microprocessor. In the upper portion of the diagram, there is provided a PC board 2002, which PC board 2002 has associated therewith various circuitry and interconnects for receiving integrated circuits. There are provided two integrated circuits, a first integrated circuit 2004 and a second integrated circuit 2006. The first integrated circuit is a data converter integrated circuit. In the upper portion, the integrated circuit 2004 is a time domain data converter. It is operable to receive an input analog signal, convert it to a digital data signal in the time domain for output therefrom. This integrated circuit 2004 has a particular pin configuration that interfaces with the various "traces" or interconnects on the PC board 2002 which allow each of the pins on the integrated circuit (not shown) to be interconnected to such things as ground, power supply voltages, control signals and the such. The integrated circuit 2004 is interfaced with input circuitry through an input interface 2008, which input interface allows control signals, if necessary, to be input to the integrated circuit 2004, and analog input terminals to receive analog input signals, which can be a single ended input or double ended input, and other necessary interface signals.

The data converter integrated circuit 2004 is operable to interface with the integrated circuit 2006 through an interface 2010, which is illustrated as a bus. However, this bus is operable to provide data lines from the integrated circuit 2004 to the integrated circuit 2006, data lines in the reverse direction and also for control lines from the integrated circuit 2006 to the integrated circuit 2004. There also can be provided control lines or indicator outputs from the integrated circuit 2004 to the integrated circuit 2006 that do not constitute a data input but, rather, commands and control lines. This, of course, depends upon the functionality of the integrated circuit 2004.

The integrated circuit 2006 is a microprocessor, this microprocessor having contained therein instruction code that allows it to operate in a predetermined manner. Typically, these microprocessors will have a certain "form" or pin configuration that allows it to interface with the PC board 2002. Typically, the processing capability of a microprocessor 2006 is such that there will be provided some limitations thereto. If additional processing capability is required, typically this will require a different chip with a different pin configuration, i.e., not board compatible. Therefore, the configuration of the PC board 2002 in the upper portion with the time domain data converter, comprising the integrated circuit 2004, and the microprocessor, comprising the integrated circuit 2006, provide a time domain operation wherein the microprocessor is operable to operate on the time domain output information from the data converter 2004. The microprocessor is configured such that it can control the data converter to retrieve information therefrom, possibly input configuration data thereto and the such. This is a conventional operation.

Referring further to FIG. 20, there is illustrated in the lower portion thereof the second configuration. This configuration is such that it utilizes the same PC board 2002 but it utilizes a different integrated circuit 2020 in place of the integrated circuit 2004. However, since the same PC board 2004 is utilized, the upper board configuration and the lower board configuration are identical; that is, there are no required changes to the physical board between utilizing the integrated circuit 2004 and the integrated circuit 2020 in order to interface with any of the circuitry or interconnections on the PC board 2002. Further, the microprocessor in the integrated circuit 2006 can be identical for both the upper and lower configurations with integrated circuits 2004 and 2010 being the only difference as to the different parts utilized, to provide a different functionality without requiring a different board layout. The input interface 2008 is also board compatible. However, the microprocessor could be a faster circuit, but it must be pin-compatible, such that it will replace the slower processor without requiring a re-layout of the PC board 2002. Also, the microprocessor in integrated circuit 2006 is reprogrammed to operate on the frequency domain information as opposed to the time domain information in the lower configuration. If any control signals are required to interface with the time domain/frequency domain data conversion functionality as compared to that of the time domain data conversion functionality, these control lines exist between the microprocessor and the integrated circuit position occupied by either the integrated circuit 2004 or the integrated circuit 2020; that is, there are provided compatible pins on each of the integrated circuits 2004 and 2020 for interconnection to the microprocessor in integrated circuit 2006. Therefore, no alterations are required on the PC board 2002 in order to allow interface to either the time domain conversion functionality or the time domain/frequency domain data conversion functionality. In such a manner, the designer now has an design wherein the two integrated circuits 2004 and 2020 are "board compatible." This board compatibility allows the user to insert a data converter that either outputs time domain information only or both time and/or frequency domain information, both receiving an analog input on the input, for a compatible input pin. The microprocessor in the integrated circuit 2006 need not be exchanged but, rather, need only be reprogrammed to receive the information. For example, if both of the data converters in integrated circuit 2004 and 2020 provide a single output, the microprocessor in integrated circuit 2006 would only recognize one or the other for a given set of program instructions. However, since the data converters are board compatible and provide a single output interfaced between the board compatible integrated circuit and the integrated circuit 2006, only a programming change is required in the microprocessor. Programming is not required in microprocessor to receive the time domain information and then process it through a time domain/frequency domain transform algorithm in order to provide a frequency domain functionality, but, rather, this functionality is transferred over to the data converter integrated circuit. By shifting the processing requirements for this transform to the data converter integrated circuit and providing a common interconnection between an already existing microprocessor and a data conversion operation, more functionality is provided to the user.

Statistical Domain Analog-to-Digital Converter

Figure 21:
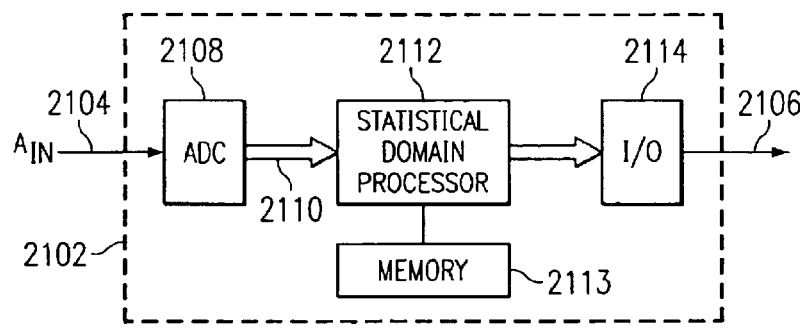
FIG. 21 illustrates a block diagram of a statistical domain analog-to-digital converter.

Referring now to FIG. 21, there is illustrated a block diagram of a statistical domain analog-to-digital converter (SDA/DC) 2102. The SDADC is a monolithic chip having a plurality of inputs and outputs, only two of which are shown. These are the analog input 2104 and a statistical data output 2106. Additionally, although not shown, there are provided various power supply pins, control pins and the such. These are similar to those described hereinabove with respect to the integrated circuit 201 in FIG. 2.

The SDADC 2102 has contained therein an analog-to-digital converter (ADC) 2108, which is operable to receive the analog input signal and convert it to a digital signal on an output 2110. This is then input to a statistical domain processor 2112, which processor 2112 is operable to determine certain statistics about the data on the output 2110. There is provided a memory 2113 in association with the processor 2112. The output of the statistical domain processor 2112 is processed through an I/O block 2114, as described hereinabove, which can be comprised of a serial port or some type of serial interface. This processor 2112 works in accordance with a predetermined statistical algorithm, which can be tailored to any particular type of application. This can provide on the output thereof access to stored statistical information for downloading by an external processor or this can be a flag that is set indicating an abnormal statistical pattern. These will be described hereinbelow.

Figure 22:
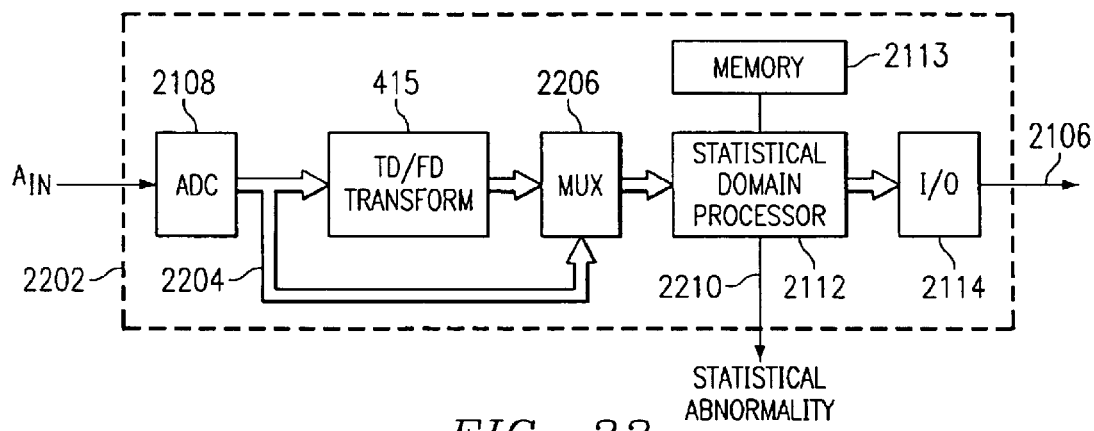
FIG. 22 illustrates a block diagram of a data converter with a statistical domain processor and also a time domain/frequency domain transform operation.

Referring now to FIG. 22, there is illustrated a block diagram of an alternate embodiment of the SDADC 2102, an SDADC 2202. The SDADC 2202 incorporates the time domain/frequency domain transform block 415 of FIG. 4. In this embodiment, the ADC 2108 provides an output to a bus 2204 which is input to the time domain/frequency domain transform block 415 or to one input of a multiplexer 2206. The multiplexer 2206 also receives the output of the time domain/frequency domain transform block 415. The multiplexer 2206 is selectable such that the statistical domain processor 2112 can operate on either the output of the transform block 415 or the direct time domain output from the ADC 2108. The output of the statistical domain processor 2112, can either be output through the I/O interface 2114 or it can provide a separate output in the form of a statistical abnormality output on a line 2210. This is very similar to the data-ready output described hereinabove with the exception that it provides information to the external system that data exists indicating a statistical abnormality. Alternatively, this line 2210 could indicate the completion of a statistical operation by the statistical processor, i.e., a histogram, such that an external processor could then access the information. Further, the output 2210 can also indicate that the statistical processing is complete for a given block of data and that this can then be output by the user, this being described hereinbelow in more detail.

Figure 23:
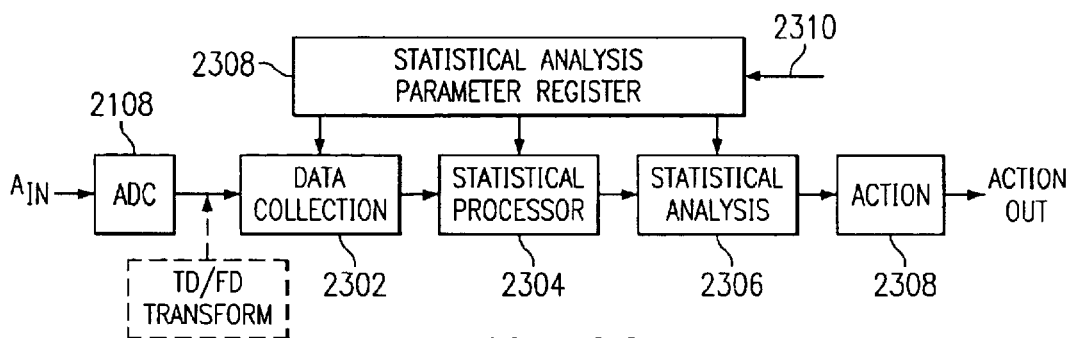
FIG. 23 illustrates a more detailed block diagram of the statistical domain processor.

Referring now to FIG. 23, there is illustrated a more detailed block diagram of the overall statistical processing operation. Analog input data, after being processed by the ADC 2108, must then go to a data collection block 2302. Most types of statistical operations require more than a single point of data in order determine statistics, i.e., they require a group of data points. The data is collected by the data collection block 2302 and then input to a statistical processor block 2304, which statistical processor block 2304 is operable to perform the predetermined statistical processing on the collected data. This could be as simple as determining the mean, standard deviation or crest factor (ratio of the peak value to the standard deviation) of the data or it could involve a more complex statistical algorithm to perform statistical quality control. The output of the statistical processor will then be passed to a statistical analysis block 2306 which is operable to analyze the collected statistics. For example, the statistical processor 2304 could collect groups of data points, average these groups of data points and define a mean of the average. The statistics will be in the raw form and the statistical analysis block 2306 would then interpret these results to determine, for example, if there were an abnormal pattern to the statistics. The data collection block, the processor block 2304 and the analysis block 2306 are all operated in accordance with various parameters which are stored in a statistical analysis parameter register 2308. This is a configurable register which is operable to receive configuration data on an external line 2310. It should be understood that, although not shown, the statistical domain processor 2112 interfaces outside the integrated circuit in a similar manner to the time domain/frequency domain embodiment of FIG. 11, in that there is provided a serial interface (not shown) that can allow information to be input to the integrated circuit and output therefrom. The parameter register 2308 is very similar to the control register 534 in that it allows information to be stored as to the overall operation of the integrated circuit. Further, multiplexing operations can be provided for directly interfacing with the output of the ADC 2108. However, the embodiment of FIG. 21 and following FIGURES incorporate the various functionality required to interface with the integrated circuit for input/output and control operations.

Once the statistical analysis in block 2306 has been performed, then there will be some type of action taken, as indicated by block 2308. This action block can take many forms. In some applications, the action to be taken could be as simple as setting a flag, i.e., changing the output level of a pin. Alternatively, the action could be to raise a statistical data-ready pin to a high voltage level indicating to an external processor that statistical data is ready to be output. By way of example, if the statistical processing and analysis performed were that of generating a histogram, then the values for the histogram could be downloaded through the serial port, this being described in more detail hereinbelow.

When statistical analysis is utilized to identify unnatural statistical patterns in order to determine whether a process is behaving unnaturally, principles of statistical quality control are utilized. These techniques are utilized by process operators to identify when a parameter in a particular process is fluctuating within its natural range or it is fluctuating outside of its natural range, in which case maintenance or adjustment is required. These principles are set forth in the "Statistical Quality Control Handbook," Western Electric Company, 1956, which reference is incorporated herein by reference. With the use of statistical quality control, numbers or values relating to a process are utilized in conjunction with the characteristics of the process to allow an operator to modify the process, if necessary, to make it behave in a desirable manner. One aspect of statistical quality control is the generation of control charts. A control chart basically comprises a plot of groups of n samples in the sequence that they occur. There are provided control limits that represent the width or spread of a distribution or pattern, control limits typically representing the width or spread of the fluctuations in a "natural" pattern. These typically spread to +/−3 sigma away from the mean, where sigma is the standard deviation of the process. These control limits are used to determine whether the pattern is "natural" or "unnatural."

The general procedure for generating a control chart is as follows:

a) The fluctuating pattern is examined to determined whether it is in conflict with the natural statistical limits. The pattern is in conflict if it (a) jumps outside the control limits or (b) forms unnatural clusters of points inside the control limits.

B) Any unnatural points or clusters of points are "tagged," this being an indication that they are outside of acceptable limits C) If the pattern is not in conflict with the limits; that is, there are no tagged groups, this would be termed a "natural" pattern. In general, the longer this series of points (each point being a group of sample values) without evidence of unnaturalness, the stronger is the evidence that this constitutes a natural pattern. (It is noted that an occasional tagged point, perhaps once in hundredth points, may be the result of chance alone, and is not considered to make the pattern unnatural.)

D) If the pattern is determined to be in conflict with the control limits; there are a number of tagged points, then the pattern is considered to be "unnatural" and the process "out of control." The more numerous the tagged points, in general, the stronger is the evidence of lack of control. This information can be used by the statistical analysis block 2306 in order to determine what type of action can be taken.

When a pattern is natural, this means that there are no abnormal extraneous causes working in the process. When the pattern is unnatural, it means that outside disturbances are present and are affecting the process.

There are a number of different kinds of control charts that can be generated. These control charts are based either on percentages or on individual measurements. However, control limits can be applied with equal ease to any other form of data. The most common kinds of data that are utilized with the control charts:

Ranges (difference between highest and lowest in a small group of measurements).

Averages (especially in small groups).

Percentages—or counts, which are another form of percentages.

Individual numbers, such as temperatures, pressures, records of earnings or absences, chemical analysis etc.

The two most sensitive kinds of data, ranges and averages, are typically plotted together in the form of an "X-Bar and R" chart. This is considered one of the most powerful of all control charts for diagnosing control troubles. There are also p-charts which use percentages, and "charts with control limits based on the moving range," which make use of individual numbers.

The X-Bar is pronounced "X-bar" and means the average value of the sample of the measured quantity. The R stands for "range," or difference between highest and lowest of a sample. This chart is plotted as pair of patterns, one for average and one for range. In general, the R pattern is read first, and from this it is possible to identify many causes directly. The X-Bar pattern is read in light of the R chart, and this makes it possible to identify other causes. Finally, the X-Bar pattern and the R pattern are read jointly, which provides still further information.

In general, the X-Bar value represents the average of a plurality of samples, there being n samples in a group. This average is calculated by taking all of the samples, adding them together and then dividing them by n. There is also provided X-Bar$_{AV}$, which represents the average of a series X-Bar values. The R value represents the difference between the largest and smallest reading of a sample of n measurements with the average thereof represented by R$_{AV}$ represents the average of a series of R values.

In general, the X-Bar and R charts are made by first deciding on a sample size (n) to be utilized. A series of groups of n samples are then collected, there typically being 20 or more groups of the samples. Additionally, these samples do not need to be taken at the same time, but can be taken on a quasi-periodic basis. The value of R is computed for each sample and then the average R$_{AV}$ is then determined. This provides a center line for the R chart. It generally is drawn as a solid horizontal line. The value R$_{AV}$ is then multiplied by an upper control limit factor and a lower control limit factor to determine the control limits on either side of the center line. The R values are then examined in each group with respect to these limits and average value. In general, if the R values are closely spaced with respect to the average value, the process appears to be uniform. If it is out of control, then the R points will be spread out.

When the X-Bar chart is made, the same groups of measurements that were used for generating the R chart with the X-Bar value for each group is determined, this being the average of all samples therein. The average of all X-Bar values then determined as X-Bar$_{AV}$ is then determined. This is the virtual center line for the chart. There are then provided control limits which in general are the value of R$_{AV}$ is then multiplied by factors to determine the control limits, i.e., the width of the limits about the center line X-Bar$_{AV}$. The successive values of X-Bar are then compared to the center line or the X-Bar$_{AV}$. The X-Bar values are then tagged in accordance with predetermined rules for interpreting these values. In general, the X-Bar chart indicates where the process is centered. If it is natural, the center of the process is not shifting. If the X-Bar chart indicates a trend, the center of the process will be moving gradually up or down. If the X-Bar chart is erratic and out of control, something is changing the center rapidly and consistently. Therefore, the indication would be where the successive values of X-Bar are varying in one direction or the other from the center line.

Figure 24:
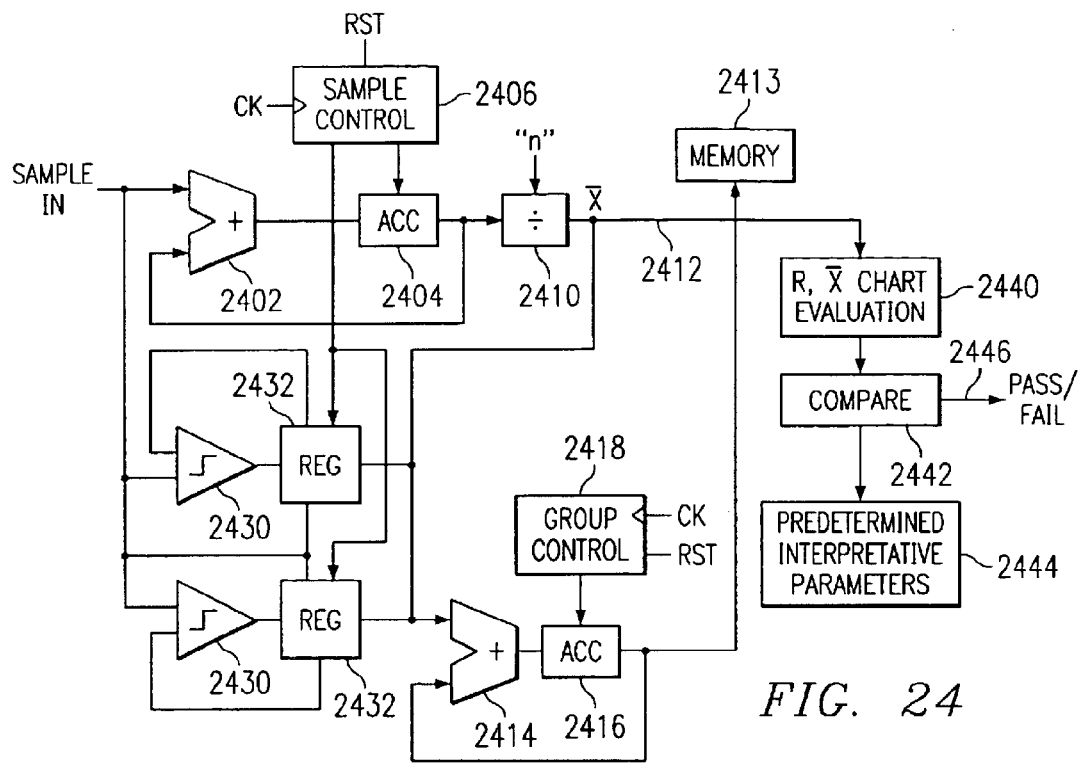
FIG. 24 illustrates a block diagram of one statistical operation.

Referring now to FIG. 24, there is illustrated a block diagram of the operation of generating the R and X-Bar-charts. The X-Bar value is determined by collecting samples wherein the input sample value is input to an adder 2402 which feeds an accumulator 2404. The values are summed for n samples controlled by a sample counter 2406 which counts from a reset value of "zero" to a value of n. Once the value of n is reached, then the contents in accumulator 2404 are input to a divide block 2410 for division by n. This provides the X-Bar value. This is output on the line 2412 to a memory 2413. In addition, the determined value of X-Bar is input to an adder 2414 for the purpose of generating a running average X-Bar$_{AV}$ by providing the output to an accumulator 2416, the output thereof fed back to the input of the adder 2414. A group counter keeps count of the accumulated X-Bar values for a predetermined number of groups, this provided by counter 2418. The value X-Bar$_{AV}$ is then stored in the memory 2413.

The R value is determined by inputting the sample to a window comparator 2430 which is operable to drive a low range register 2431 and a high range register 2432. The registers are operable to store the sample value when it is determined that the previously stored value is either less than the stored valued for the high range or greater than the stored value for the low range. This continues for n samples as controlled by the sample counter 2406. At the end of the n samples, the difference between the two values is stored in the memory 2413 as the range.

When the data is collected for the R and X-Bar-charts, this data can be retrieved from the memory 2413 by a chart evaluation block 2440. This basically can evaluate the various aspects of the information which is then compared with a comparator 2442 to predetermine interpretation parameters stored in a register 2444. This can then determine pass/fail operation on a line 2446.

It can be seen that by performing the statistical processing of time domain data (and/or frequency domain data), the use of the I/O bandwidth of the overall integrated circuit can be maximized. This is due to the fact that the processing of the time domain and/or frequency domain data occurs on chip and can therefore utilize the wider data paths. Second, the amount of data that is actually transferred from the integrated circuit is significantly less, since it is the result of processing of the data. For example, it may be that the only information passed from the chip is the flag or indicator bit that indicates that an unnatural pattern exists. Alternatively, the results on the forms of the R and X-Bar chart information could be downloaded by the user in response to sending a statistical data-ready signal to the user or to the external processor. This amount of data is significantly reduced over the actual samples that were processed to achieve this data.

Another statistical operation is that of a histogram. The histogram can be associated with a number of occurrences of each ADC digital output word. For example, if there are 4,096 digital words (12-bit ADC) and the assumption is made that there is a maximum of 256 counts in each ADC code or histogram bin, the histogram would require that there be provided 4,096 memory bins, each memory bin incremented for each occurrence of a digital word up to a value of 256 (the saturation value). By receiving sequential samples, a histogram thereof can be collected and a significantly lower amount of data is then required to be output from the integrated circuit.

With respect to FIG. 24, the running average X-BAR$_{AV}$ is calculated and stored in the memory on-chip and all of the parameters in terms of the control limits, etc., are determined and stored in the memory on chip. However, these integrated circuits are "volatile," and this could provide a problem with maintaining the overall parameters that are stored in the memory. As an alternative, the overall control limits and ensemble averages X-BAR$_{AV}$ could be calculated in the external processor and then sent back to the statistical domain processor 2112. This will alleviate the situation where the SDADC does not either have the capability to maintain the limits and the ensemble averages or does not have the ability to forward these values to a non-volatile memory. Typically, the system microcontroller or external processor will have access to some type of non-volatile memory.

Figure 25:
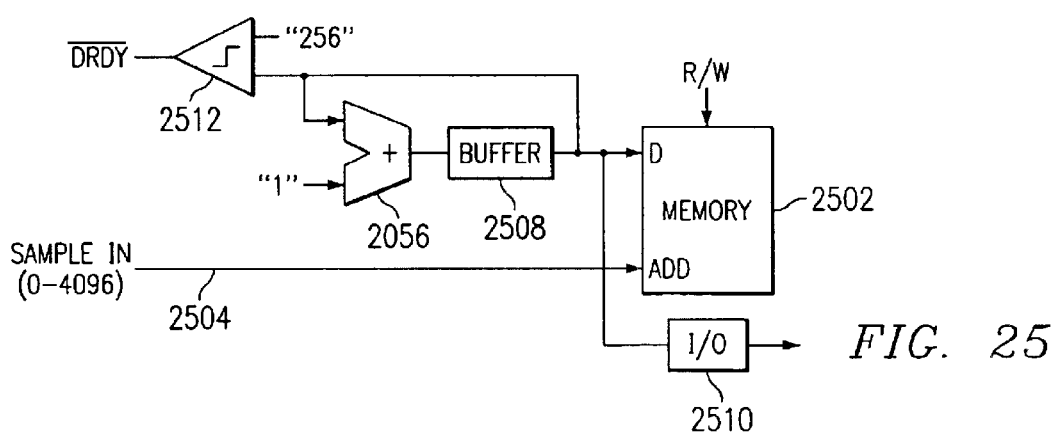
FIG. 25 illustrates a block diagram of an alternate statistical operation.

Referring now to FIG. 25, there is illustrated a simplified block diagram illustrating the steps necessary to collect data for a histogram. A memory 2502 is provided which is a 4K×8 memory which has a 12-bit address input. The address is received on an input 2504 which comprises the actual sample value, between 0 and 4,096. Therefore, there is one addressable location for each value of the sample word. An increment circuit is provided which is comprised of an adder 2506 and a buffer 2508 wherein the output of the buffer is fed back to the other input of the adder 2506 and a value of "1" is added to the first input of the adder 2506. When a new sample is received, the addressable location associated therewith is accessed, data read out and input to the other input of the adder 2506, this value incremented, stored in the buffer 2508 and then written back into the memory 2502. Once the histogram has been populated, the data can be read out through an I/O 2510 to provide the data output to the external processor or user.

Figure 26:
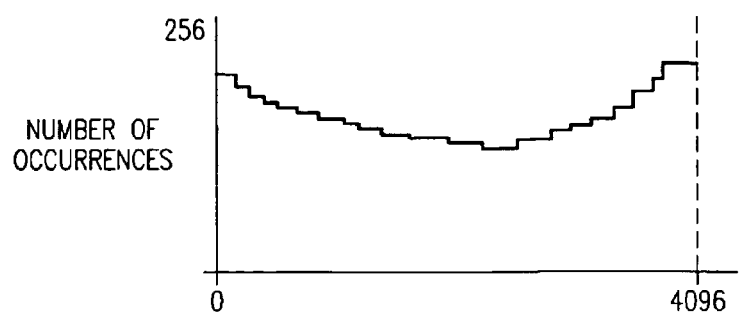
FIG. 26 illustrates a histogram associated with the embodiment of FIG. 25.

Referring now to FIG. 26, there is illustrated an example histogram of a full scale sine wave. The sine wave essentially spends a large percentage of its time at the flat tops and bottoms of the waveform. In the situation where an analog input is uniformly distributed over the full range of the ADC, the histogram can provide some benefits. In this case, $2^{20}$ samples are required before the histogram memory saturates at 256 counts in each of the 4,096 words. Once saturated, it will then be necessary to download the entire histogram, which requires only 4,096 8-bit words. This is a substantial reduction in the I/O requirements. In order to determine when the histogram is full or the locations saturated, a comparator 2512 is provided which compares the output of each of the locations in the memory 2502 as they are read with the value of "256." When any of the memory location saturates, the output of the comparator will cause a Data-Ready Bar line to go low. Also, the Data-Ready signal could also go low whenever a block ends, the Data-Ready bar signal going low upon the occurrence of either the end of the block or the saturation of any of the locations.

Figure 27:
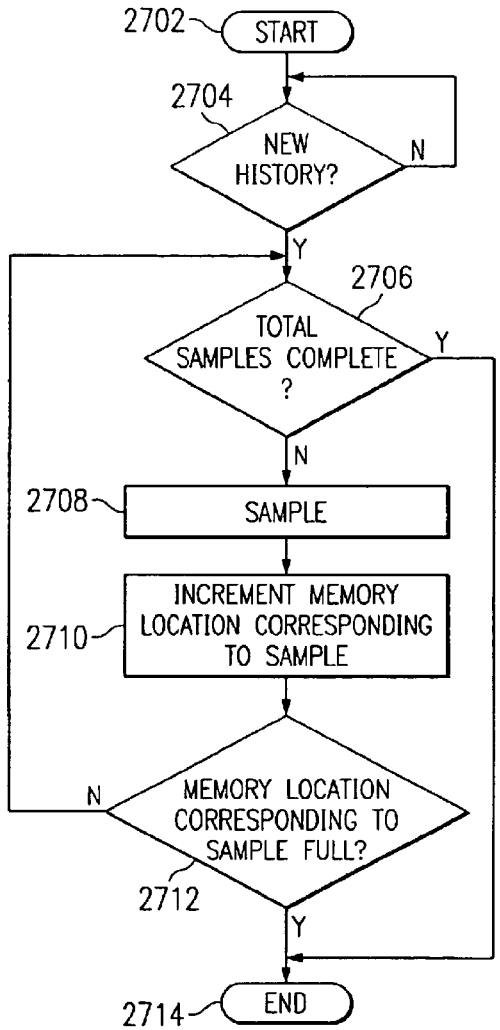
FIG. 27 illustrates a flowchart for the generation of the histogram.

Referring now to FIG. 27, there is illustrated a flowchart depicting the operation of generating the histogram. The program is initiated at a block 2702, and then proceeds to a decision block 2704 to determine if a new histogram is to be generated. When this occurs, all the memory locations are cleared to a zero value and the program proceeds to a decision block 2706 to determine if total samples are complete, i.e., have all the samples for the histogram been received. Of course, the initial pass through this program will flow through this block. If the total samples has been determined not to be complete, the program will flow to a function block 2708 to receive a sample and then to a function block 2710 to increment the memory location corresponding to the sample. As noted hereinabove, the value of the sample constitutes the address. This address location associated with the received sample is accessed, the data value output therefrom, incremented and then stored back in the memory. The program will then flow to a decision block 2712 to determine if the accessed memory location corresponding to the value of the received sample is full, i.e., is that location saturated. If not, the program will flow along the "N" path back to the input of decision block 2706. When the total samples have been processed for a given histogram, the program will flow from decision block 2706 to a terminate block 2714. Additionally, when any memory location in the memory is saturated or full, the program will flow from the decision block 2712 along the "Y" path to terminate block 2714.

Figure 28:
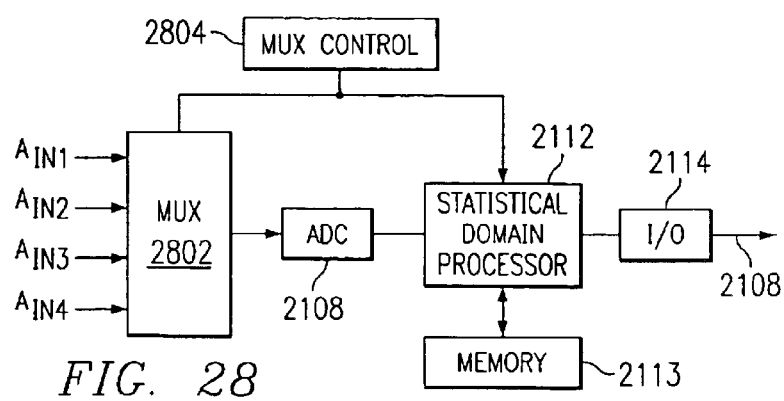
FIG. 28 illustrates a block diagram for the statistical domain data converter with multiplexed multiple inputs.

Referring now to FIG. 28, there is illustrated a block diagram of an alternate embodiment of the SDADC wherein an input multiplexer 2802 is provided for servicing a plurality of input channels, $A_{IN1}$, $A_{IN2}$, $A_{IN3}$ and $A_{IN4}$. There is provided a multiplex control circuit 2804 for controlling the multiplexer 2802 and also for collecting N samples of data of each of the channels. This is facilitated with a data collection operation that is an integral part of the statistical domain processor 2112. With the use of the multiplexer 2802, statistics can be collected on multiple inputs, the data statistically processed to determine the presence of any unnatural patterns and then the flag is output to the external processor to indicate the presence of such unnatural patterns. Data regarding this unnatural pattern can then be downloaded to the external processor.

Figure 29:
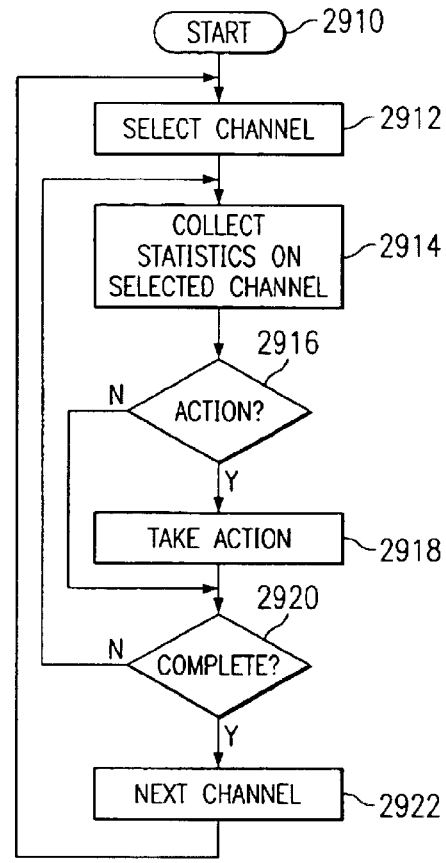
FIG. 29 illustrates a flowchart depicting the operation of the embodiment of FIG. 28.

Referring now to FIG. 29, there is illustrated a flow chart for the system of FIG. 28. The program is initiated at a start block 2910 and then proceeds to a function block 2912 wherein a channel is selected. The program then flows to a function block 2914 wherein the statistics are collected on this particular channel. If, for example, the statistics required the generation of a histogram, i.e., collecting data therefor, then the necessary data would be collected for this particular channel. The program will then flow to a decision block 2916 to determine if any action is to be taken in accordance with the collection of the statistics. For example, there may be some type of flag or alarm that needs to be generated for a given channel due to the presence of an unnatural pattern. It may be that the statistical domain processor analyzes this result to make such a determination and compares it with some type of internal threshold. In this case, there may be an action required to be taken such as setting a flag or changing the state of an output. If so, the program will flow along a "Y" path to a function block 2918 to take the action. Again, this action could be as straight forward as indicating to an external processor that the data is ready to be retrieved from memory. If no action is to be taken or if the action has already been taken, the program will flow to a decision block 2920 to determine if all of the statistics have been collected for the select channel. If not, the program will flow along a "N" path back to the input of function block 2914. When the operation is complete, the program will flow to a function block 2922 in order to select the next channel.

Since memory can be limited in integrated circuits, it may be that a histogram can only be collected for a single input channel at one time, though multiple analog input channels are multiplexed into the SDADC. It may also be that the statistics must be collected on adjacent samples. In this situation, it might be required that the statistical domain processor be dedicated to a single channel for a given amount of time. However, as memory costs and sizes are reduced and processor speeds increase, it may be that histograms for multiple channels can be collected and stored and/or the operation of collecting the histogram could actually be multiplexed due to a faster processor being available.

In one example wherein resources are limited, it may be desirable to only collect a portion of a histogram. One example would be that associated with a thermocouple. If, for example, one is monitoring 32 thermocouple channels, where each channel is producing outputs over a small range, the generation of a full histogram for each channel would be a waste, due to the fact that it is known that the operation of a thermocouple will only operate over a small range. Therefore, it is only necessary to retrieve data for a small number of histogram locations for each channel and then store these in the memory. This would require first, that data values outside of the range for any given channel have the information associated therewith discarded in the associated statistical data collection operation. Second, each of the input value ranges would have to be mapped into the memory. For example, if the range of values for a 12-bit ADC for each thermocouple ranged from 284 to 310, then all data values below 284 and above 310 would be discarded. For the first channel, the values for 284–310 would be mapped to the first 26 locations of the memory, the values for the second thermocouple mapped to the next 26 locations, and so on. After all data has been collected for the histogram, then this data would be extracted by an external processor.

Figure 30:
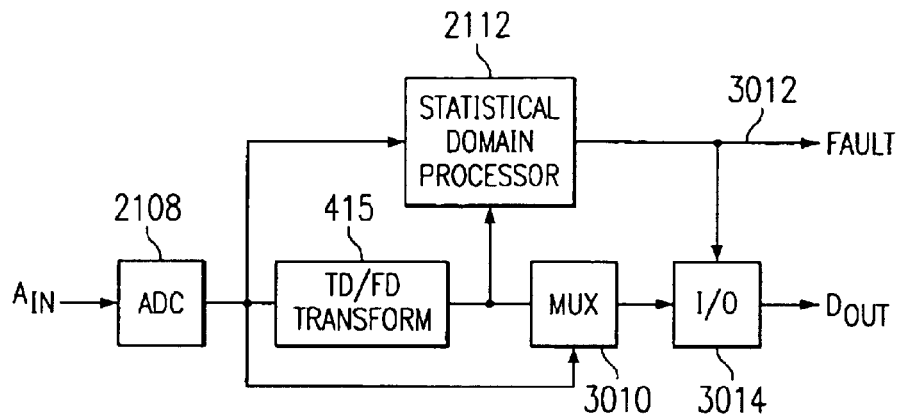
FIG. 30 illustrates a block diagram wherein the statistical domain processor operates in the background.

Referring now to FIG. 30, there is illustrated an alternate embodiment of the SDADC. In this embodiment, the statistical domain processor 2112 is operated in the background on the operation of either the time domain ADC 2102 or the combination of the ADC 2108 and the time domain/frequency domain transform block 415. The statistical domain processor 2112 collects data that is output by the ADC 2108 or that is output by the transform block 4015. This would utilize a multiplexed function (not shown), as described hereinabove with respect to FIG. 5 and similar to the multiplexer 530.

In general, the statistical domain processor 2112 is utilized to collect statistics regarding data output by either the ADC 2108 or the transform block 415. This data can be collected on sequential samples or on blocks of samples. These blocks can be collected at quasi-periodic times or continually. The statistical domain processor 2112 will analyze the statistics of the collected data and determine if there are any unnatural patterns present. If so, it will generate fault information. This fault information can be generated on a dedicated output 3112 or it can be input to an I/O block 3014, which also provides the output for either the ADC 2108 or the transform block 415. A multiplexer 3010 is provided for selecting the output of either the ADC 2108 or the transform block 415 for direct output thereof.

Whenever the statistical domain processor 2112 outputs data on the output through the I/O block 3014, this can either be an interrupt driven feature or there could merely be the insertion of a tag bit to the time sample. This would require an extra bit in each sample word. Whenever this bit were raised high, the external processor would recognize the completion of a statistical operation, the presence of an unnatural pattern, etc. this indicating a failure. A data-Ready pin 3020 is provided to indicate to the external processor that data is ready to be output. This pin is also utilized to indicate that statistical data is ready to be output. The operation of the data retrieval for both data (time domain or frequency domain) and statistical domain information from the statistical domain processor 2112 can be interleaved, as described hereinabove with respect to FIGS. 14 and 17.

Figure 31:
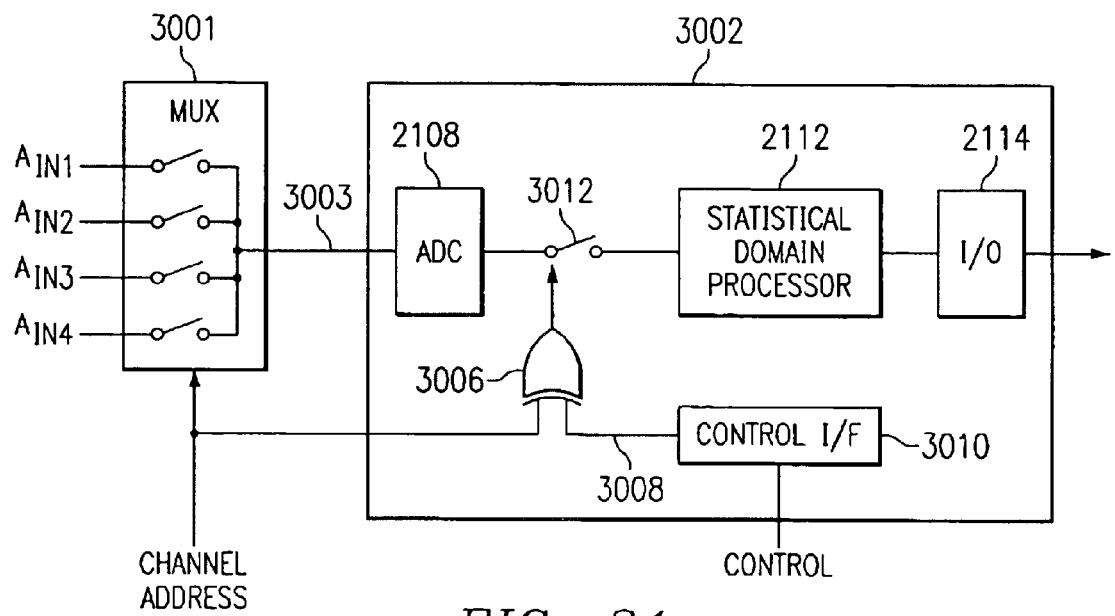
FIG. 31 illustrates a block diagram of an application of the SDAC.

Referring now to FIG. 31, there is illustrated an application of the SDADC 2102 of FIG. 21 to a multi-channel input configuration. In this application, there is provided a multiplexer 3001 which can be external or internal to the SDADC. In this embodiment, it is external. It provides for receiving four analog inputs on four channels, $A_{IN1}$, $A_{IN2}$, $A_{IN3}$ and $A_{IN4}$. The multiplexed output is provided on an output 3003 to an SDADC 3002. This is comprised of a time domain SDADC which utilizes the ADC 2108, the statistical domain processor 2112 and the I/O 2114. However, this could also incorporate the transform 415 as illustrated in FIG. 22. In the SDADC 3002, the operation thereof is enabled only when a target channel address is received. The channel address is the address that selects a given channel for analysis thereof. This channel address may be selected for collecting data with other data converters or it may be a channel address that is associated primarily with the application that is described herein. The SDADC 3002 has associated therewith an address compare circuit 3006 illustrated as an Exclusive-OR gate for simplicity. The address compare circuit 3006 compares the analog channel address, in this example, with an analysis target address on a line 3008. The statistical domain processor analyzes data whenever one of the target addresses has new data. This target address is loaded by the user into a control interface block 3010 through an external control signal. This is similar to the control register operation described hereinabove with respect to FIG. 5A and FIG. 11, utilizing the serial interface 1103. This control interface 3010 can also be utilized to input parameters to the SDADC. The Exclusive Or gate 3006 is utilized to enable the operation, illustrated by a switch 3012 disclosed between the ADC 2108 and the statistical domain processor 2112.

In general, the statistical analysis operation is not concerned with the means and deviations or the statistical parameters of the entire series of samples input to the multiplexer 3001. Rather, all that is desired is to collect statistics only when the channel address matches some predetermined target address. Further, there may be provided a timer in the control interface 3010 that only allows data to be collected and analyzed upon the jth occurrence of an address match, with j being greater than 1. This allows the system to collect statistics over long periods of time, looking for such things as temperature and other long-drift affects.

Although the above described embodiment of FIG. 31 is disclosed with respect to a single matching address, it could be that multiple addresses are compared and select channels having their outputs statistically analyzed. This would require, in one embodiment, multiple SDADCs 3002 or, alternatively, a single SDADC 3002, wherein the statistical domain processor 2112 were operated at a higher clock speed, such that all of the N samples could be processed.

Figure 32:
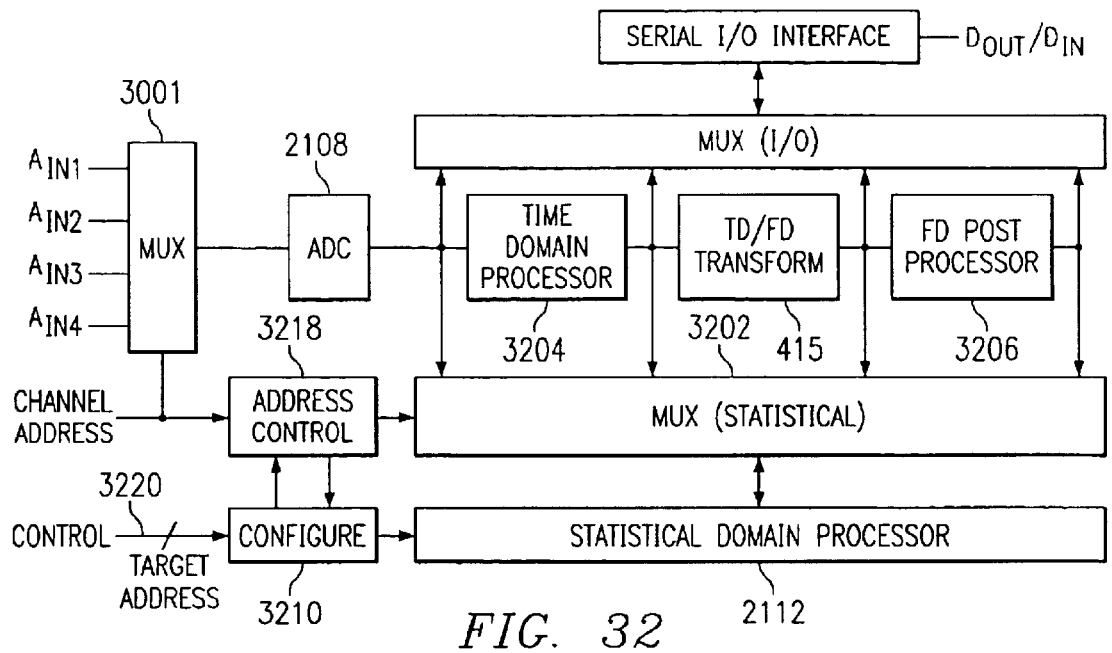
FIG. 32 illustrates a block diagram having an alternate embodiment of the SDADC.

Referring now to FIG. 32, there is illustrated an alternate embodiment of the embodiment of FIG. 31. In this embodiment, there is provided a multiplexer for statistics 3202, which is operable to select the data along the processing pipeline. In the embodiment of FIG. 2, there is illustrated additional processing in the form of time domain processing in a block 3204, the time domain/frequency domain transform 415 and some frequency domain post processing, provided by a block 3206. This was described hereinabove with respect to FIG. 19A. In this embodiment, the output of each of the blocks 2108, 3204, 415 and 3206 are input to the multiplexer 3202. The multiplexer 3202 is interfaced with the statistical domain processor 2112. This multiplexer 3202 can allow the statistical domain processor 2112 to collect statistics regarding any data output by any of the above noted blocks. A configuration block 3210 is provided for containing configuration information as to the operation of the statistical domain processor 2112. This can contain such things as control limits, block sizes and the such regarding how the statistical domain processor 2112 operates. As noted hereinabove, there are many different types of statistical algorithms that can be associated with the statistical domain processor 2112.

The multiplexer 3001 provides the ability for multiple channels to be processed by the ADC 2108. This is in response to a channel address. There is provided an address control block 3218 which is operable to receive the channel address and compare it with a target address provided by the configuration block 3210. As noted hereinabove, this target address can be internally stored or it can even be externally provided through a control input on a line 3220. The address control block 3218 is operable to compare the target address with the channel address and generate a control signal in response thereto. These control signals control both the multiplexer 3202 and the configuration block 3210. This allows the statistical domain processor to collect statistics regarding the channels associated with the target addresses from the output of select blocks in the processing pipeline. For example, it may be that one channel requires statistics to be collected regarding a frequency bin in the frequency domain, whereas another channel may require statistics to be collected on the raw output of the ADC 2108, wherein a further channel may require some time domain processing prior to collecting the statistics. The address control block 3218 can provide this information by comparing the channel address input to the multiplexer 300i with predetermined information. It may be that the information transmitted to the address control block 3218 from the configuration block 3210 (or from an external location) would have some LSBs associated therewith that define the functionality. For example, the target address could be XXXX101 for one associated multiplexed configuration and XXXX110 for another configuration. The four MSBs are associated with a channel address. Therefore, when there is a match with the MSBs, the LSBs will be utilized to control multiplexer 3202. Further, it may be that the statistical domain processor 2112 will operate differently, i.e., process a different statistical algorithm, for each multiplexed operation. It could be that, for one channel, a histogram is required to be generated, wherein frequency bin information is required for other channels utilizing the transform block 415.

Figure 33:
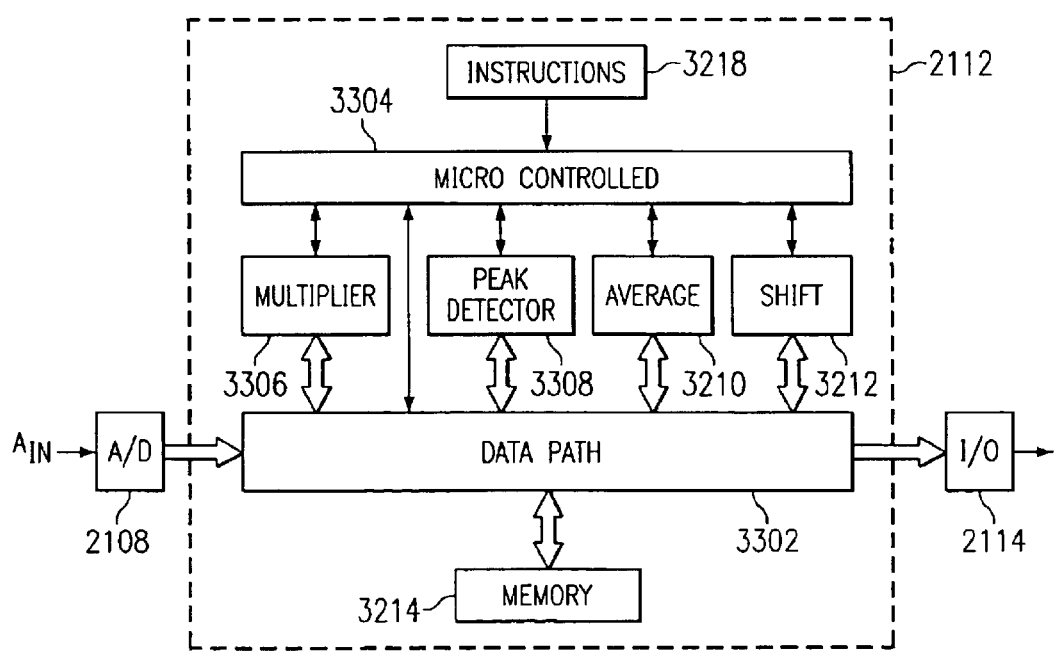
FIG. 33 illustrates a block diagram of an embodiment of the statistical domain processor utilizing a microcontroller based configuration device.

Referring now to FIG. 33, there is illustrated a block diagram of an implementation of the statistical domain processor 2112. The output of the A/D converter 2108 is input to the processor 2112 and is input to a data path block 3302. The data block path 3302 is controlled by a microcontroller 3304 which routes the data to and from various function blocks. There are illustrated four function blocks, a multiplier 3306, a peak detector 3308, an averaging block 3310 and a shift block 3312. These function blocks 3306–3312 are utilized to perform various functions. Typically, these are hard wired function blocks that perform predetermined functions on the data. Each of these blocks is interfaced to the data path block 3302 in order to receive data therefrom and provide return data thereto. The microcontroller 3304 controls how the data is routed between the various function blocks to perform an overall function. In addition, a memory 3314 is interfaced with the data path block 3302, and the data path block 3302 can interface with the I/O block 2114.

The microcontroller 3304 is operable to receive instructions from an instruction block 3318. The instructions in the instruction block 3318 define how the microcontroller 3304 sequences the operations of the various function blocks associated with the data path 3302 and how the data paths are controlled. Utilizing this configuration, it is possible to very readily redesign an integrated circuit to provide a different level of functionality thereto merely by changing the way in which the microcontroller 3304 is programmed. By providing a sufficient number of function blocks and a sufficient versatility to the manner in which they can be combined, the microcontroller 3304 can then determine how a statistical algorithm will be implemented upon receiving samples of data from the A/D converter 2108.

Although the preferred embodiment has been described in detail, it should be understood that various changes, substitutions and alterations can be made therein without departing from the spirit and scope of the invention as defined by the appended claims.

What is claimed is:

1. A method for collecting statistics in an integrated circuit on data, comprising the steps of:
   receiving on an input, input data in a first data domain;
   converting received input data with a data converter on the integrated circuit from the first data domain to a second data domain different from the first data domain;
   determining with a statistical processor statistical information from a finite collected amount of data from the output of the data converter in the second data domain the step of determining with the statistical processor providing processed statistical output information in the second data domain;
   wherein the step of determining operates on the finite amount of collected data from the step of converting;
   determining when the completion of the statistical information determining step has occurred; and
   allowing access external to the integrated circuit through an output interface on the integrated circuit to the output of the statistical processor only after the completion of the statistical information determining step.

2. The method of claim 1, wherein the step of converting operates in a time domain.

3. The method of claim 1, wherein the step of converting with the data converter operates in a time domain and further comprising the step of receiving the converted data in the second data domain from the data converter in the time domain with a time domain/frequency domain converter and converting the received data to frequency domain data in accordance with a predetermined frequency domain conversion algorithm and wherein the step of determining with the statistical processor is operable to obtain statistical information from the output of the time domain/frequency domain converter for processing thereof.

4. The method of claim 3 and further comprising multiplexing with a multiplexer the operation of the step of determining with the statistical processor to select either the output of the data converter or the output of the time domain/frequency domain converter.

5. The method of claim 1 and further comprising storing in memory at least a portion of the processed obtained statistical information.

6. The method of claim 1, wherein:
   the step of converting with the data converter is operable to convert the received input data in the first domain to a second domain at a first data width to provide a first amount of data; and
   the step of determining with the statistical processor is operable to generate a second and lesser amount of data than the output of the data converter as a result of processing thereby of the obtained statistical information.

7. The method of claim 1, wherein the first domain is an analog data domain and the second domain is a digital data domain.

8. The method of claim 7, wherein the step of converting with the data converter has an output in the digital domain of a first data width and an associated data transfer rate and the output interface has a second data width less than the first data width.

9. The method of claim 8, wherein the step of interfacing provides a serial output interface.

10. The method of claim 1 and further comprising the steps of:
    providing a dedicated output indicative of information regarding the processing by the step of determining with the statistical processor; and
    step of determining with the statistical processor operable to generate an indication for output on the dedicated output.

11. The method of claim 1, wherein the step of converting with the data converter provides samples at a predetermined sample rate and the step of determining with the statistical processor operates on a dataset of the samples as the obtained statistical information.

12. The method of claim 11, wherein the samples in the dataset are adjacent and consecutive.

13. The method of claim 11, wherein the samples in the dataset are quasi-periodic.

14. The method of claim 1, wherein the step of determining with the statistical processor is further operable to process the obtained statistical information in accordance with a predetermined processing algorithm to provide processed statistical information.

15. The method of claim 14, wherein the step of determining with the statistical processor is operable to process the obtained statistical information to determine if the underlying data has an unnatural pattern associated therewith.

16. The method of claim 15, wherein the step of interfacing includes the step of outputting a signal indicative of the presence of an unnatural pattern.

17. The method of claim 1, wherein the step of converting with the data converter operates in the time domain and further comprising the step of processing with a post processor to further process the output of the data converter in accordance to a predetermined processing algorithm.

18. The method of claim 17, and further comprising for multiplexing with a multiplexer the operation of the statistical processor to select either the output of the data converter or the output of the post processor.

19. The method of claim 1, wherein the step of determining with the statistical processor includes the step of determining the completion of a statistical operation and the output interface is operable to provide as an output an indication of such completion.

20. The method of claim 19, wherein the step of interfacing is operable to output data and the indication is embedded within the output data as an addendum thereto.

21. The method of claim 19, wherein the completion of the statistical operation comprises determining the presence of an unnatural pattern.

22. The method of claim 1, wherein the step of interfacing allows external access to the output of the data converter.

23. An integrated circuit, comprising:

an input for receiving input data in a first data domain;

a data converter for converting received input data from said first data domain to a second data domain different from said first data domain, said data converter collecting data in finite amounts;

a statistical processor for determining statistical information from the output of said data converter, said statistical processor operating on said finite amounts of data to provide a statistical result on each of said finite amounts of data, the statistical processor providing processed statistical output information in said second data domain; and an output interface for allowing external access to the output of said statistical processor at the completion of processing of a given one of said finite amounts of data.

24. The integrated circuit of claim 23, wherein said data converter operates in a time domain.

25. The integrated circuit of claim 23, wherein said data converter operates in a time domain and further comprising a time domain/frequency domain converter that is operable to receive the converted data in said second domain from said data converter in the time domain and convert the received data to frequency domain data in accordance with a predetermined frequency domain conversion algorithm and wherein said statistical processor is operable to obtain statistical information from the output of said time domain/frequency domain converter for processing thereof.

26. The integrated circuit of claim 25 and further comprising a multiplexer for multiplexing the operation of said statistical processor to select either the output of said data converter or the output of said time domain/frequency domain converter.

27. The integrated circuit of claim 23 and further comprising a memory for storing at least a portion of the processed obtained statistical information.

28. The integrated circuit of claim 23, wherein:

said data converter is operable to convert the received input data in said first domain to a second domain at a first data width to provide a first amount of data; and said statistical processor is operable to generate a second and lesser amount of data than the output of said data converter as a result of processing thereby of said obtained statistical information.

29. The integrated circuit of claim 23, wherein said first domain is an analog data domain and said second domain is a digital data domain.

30. The integrated circuit of claim 29, wherein said data converter has an output in the digital domain of a first data width and an associated data transfer rate and said output interface has a second data width less than said first data width.

31. The integrated circuit of claim 30, wherein said output interface provides a serial output interface.

32. The integrated circuit of claim 23 and further comprising:

a dedicated output indicative of information regarding the processing by said statistical processor; and said statistical processor operable to generate an indication for output on said dedicated output.

33. The integrated circuit of claim 23, wherein said data converter provides samples at a predetermined sample rate and said statistical processor operates on a dataset of said samples as said obtained statistical information.

34. The integrated circuit of claim 33, wherein said samples in said dataset are adjacent and consecutive.

35. The integrated circuit of claim 33, wherein said samples in said dataset are quasi-periodic.

36. The integrated circuit of claim 23, wherein said statistical processor is further operable to process said obtained statistical information in accordance with a predetermined processing algorithm to provide processed statistical information.

37. The integrated circuit of claim 36, wherein said statistical processor is operable to process said obtained statistical information to determine if the underlying data has an unnatural pattern associated therewith.

38. The integrated circuit of claim 37, wherein said output interface includes means for outputting a signal indicative of the presence of an unnatural pattern.

39. The method of claim 23, wherein said data converter operates in the time domain and further comprising a post processor for further processing the output of said data converter in accordance to a predetermined processing algorithm.

40. The method of claim 39, and further comprising a multiplexer for multiplexing the operation of said statistical processor to select either the output of said data converter or the output of said post processor.

41. The method of claim 23, wherein said statistical processor includes means for determining the completion of a statistical operation and said output interface is operable to provide as an output an indication of such completion.

42. The method of claim 41, wherein said output interface is operable to output data and said indication is embedded within said output data as an addendum thereto.

43. The method of claim 42, wherein said completion of said statistical operation comprises determining the presence of an unnatural pattern.

44. The method of claim 23, wherein said output interface allows external access to the output of said data converter.

* * * * *